(12) United States Patent
Grimbergen et al.

(10) Patent No.: US 6,835,275 B1
(45) Date of Patent: Dec. 28, 2004

(54) REDUCING DEPOSITION OF PROCESS RESIDUES ON A SURFACE IN A CHAMBER

(76) Inventors: Michael N. Grimbergen, Redwood City, CA (US); Xue-Yu Qian, San Jose, CA (US)

( * ) Notice: Subject to any disclaimer, the term of this patent is extended or adjusted under 35 U.S.C. 154(b) by 354 days.

(21) Appl. No.: 09/667,362

(22) Filed: Sep. 21, 2000

Related U.S. Application Data

(63) Continuation-in-part of application No. 09/096,728, filed on Jun. 11, 1998, now Pat. No. 6,390,019.

(51) Int. Cl.$^7$ .................... H01H 21/306; C23C 16/00
(52) U.S. Cl. ................ 156/345.24; 156/345.25; 156/345.28; 156/345.48; 118/712; 118/713; 118/723 I; 118/723 R
(58) Field of Search ............... 118/712, 713, 118/723 I, 723 AN, 723 R, 723 E, 723 MW; 156/345.24, 345.25, 345.43, 345.44, 345.47, 345.48

(56) References Cited

U.S. PATENT DOCUMENTS

| | | | | |
|---|---|---|---|---|
| 3,170,383 A | * | 2/1965 | Hunt | 454/370 |
| 3,316,468 A | | 4/1967 | Hanks | 361/233 |
| 4,037,945 A | | 7/1977 | Wollam | 350/319 |
| 4,384,938 A | * | 5/1983 | Desilets et al. | 204/298.33 |
| 5,074,985 A | | 12/1991 | Tamura et al. | 204/298.11 |
| 5,129,994 A | | 7/1992 | Ebbing et al. | 156/643 |
| 5,277,746 A | | 1/1994 | Anderson | 156/603 |
| 5,290,383 A | | 3/1994 | Koshimizu | 156/345 |
| 5,322,590 A | | 6/1994 | Koshimizu | 156/626 |
| 5,370,765 A | | 12/1994 | Dandl | 156/643 |
| 5,531,862 A | | 7/1996 | Otsubo et al. | 156/643.1 |
| 5,565,114 A | * | 10/1996 | Saito et al. | 216/60 |
| 5,622,635 A | | 4/1997 | Cuomo et al. | 216/68 |
| 5,728,253 A | * | 3/1998 | Saito et al. | 156/345.25 |
| 5,738,756 A | | 4/1998 | Liu | 156/627.1 |
| 5,748,297 A | * | 5/1998 | Suk et al. | 356/72 |
| 5,759,424 A | | 6/1998 | Imatake et al. | 216/60 |
| 5,770,097 A | * | 6/1998 | O'Neill et al. | 216/60 |

(List continued on next page.)

FOREIGN PATENT DOCUMENTS

| | | | |
|---|---|---|---|
| EP | 0607797 | | 7/1994 |
| EP | 0801413 | | 10/1997 |
| EP | 0908922 | | 4/1999 |
| JP | 61160926 | | 7/1986 |
| JP | 62-42514 | * | 2/1987 |
| JP | 63253617 | | 10/1988 |
| JP | 03015198 | | 1/1991 |
| JP | 7280020 | | 5/1997 |
| JP | 9-232099 | * | 9/1997 |
| JP | 11176815 | | 7/1999 |
| WO | WO9844535 | | 10/1998 |
| WO | WO9848444 | | 10/1998 |
| WO | WO9914791 | | 3/1999 |
| WO | WO 99/65056 | | 12/1999 |

OTHER PUBLICATIONS

PCT Search Report dated Sep. 15, 1999.
PCT Search Reference from International Application No. PCT/US 01/29802. Mailed on Feb. 05, 2002.
PCT Search Report dated Sep. 15, 1999.

*Primary Examiner*—Jeffrie R. Lund
(74) *Attorney, Agent, or Firm*—Janah & Associates; Joseph Bach

(57) ABSTRACT

A process chamber 35 capable of processing a substrate 30 and monitoring a process conducted on the substrate 30, comprises a support 45, a gas inlet, a gas energizer, an exhaust 85, and a wall 38 having a recess 145 that is sized to reduce the deposition of process residues therein. A process monitoring system 35 may be used to monitoring a process that may be conducted on a substrate 30 in the process chamber 25 through the recess 145 in the wall 38.

36 Claims, 16 Drawing Sheets

U.S. PATENT DOCUMENTS

| | | | |
|---|---|---|---|
| 5,792,272 A | * 8/1998 | van Os et al. | 118/723 R |
| 5,800,688 A | 9/1998 | Lantsman et al. | 204/298.11 |
| 5,885,402 A | * 3/1999 | Esquibel | 156/345.24 |
| 6,006,694 A | * 12/1999 | DeOrnellas et al. | 118/723 I |
| 6,052,176 A | * 4/2000 | Ni et al. | 356/72 |
| 6,129,807 A | * 10/2000 | Grimbergen et al. | 156/345.24 |
| 6,132,566 A | * 10/2000 | Hofmann et al. | 204/192.17 |
| 6,207,008 B1 | 3/2001 | Kijima | 156/626.1 |
| 6,390,019 B1 | * 5/2002 | Grimbergen et al. | 118/723 R |
| 6,400,458 B1 | * 6/2002 | Howald | 356/496 |
| 6,623,595 B1 | * 9/2003 | Han et al. | 156/345.1 |
| 6,712,927 B1 | * 3/2004 | Grimbergen et al. | 156/345.24 |
| 2002/0183977 A1 | * 12/2002 | Sui et al. | 702/188 |
| 2004/0035529 A1 | * 2/2004 | Grimbergen | 156/345.24 |

* cited by examiner

REDUCING DEPOSITION OF PROCESS RESIDUES ON A SURFACE IN A CHAMBER

CROSS-REFERENCE

This application is a continuation-in-part of U.S. patent application Ser. No. 09/096,728 entitled "CHAMBER HAVING IMPROVED PROCESS MONITORING WINDOW," filed on Jun. 11, 1998 now U.S. Pat. No. 6,390,019, which is incorporated herein by reference in its entirety.

BACKGROUND

The present invention relates to an apparatus and method for reducing the deposition of process residues on a surface in a chamber.

In substrate fabrication processes, semiconductor, dielectric, and conductor materials are formed on a substrate and etched to form patterns of gates, vias, contact holes or interconnect lines. These materials are typically formed by chemical vapor deposition (CVD), physical vapor deposition (PVD), oxidation and nitridation processes. For example, in CVD processes, a reactive gas is used to deposit a layer of material on the substrate, and in PVD processes, a target is sputtered to deposit material on the substrate. In oxidation and nitridation processes, a layer of oxide or nitride, typically silicon dioxide or silicon nitride, respectively, is formed by exposing the substrate to a suitable gaseous environment. In etching processes, a patterned etch-resistant mask of photoresist or hard mask is formed on the substrate by photolithographic methods, and the exposed portions of the substrate are etched by an energized gas. In such processes, it is often desirable to change process conditions or stop processing of the substrate at a predetermined stage. For example, in the etching of gate structures, it is desirable to stop etching of overlying polysilicon when the underlying gate oxide is reached. As another example, it is often desirable to stop a deposition, oxidation or nitridation process when a predetermined thickness of material is obtained.

During the substrate fabrication processes, it is desirable to reduce the deposition of process residues on the walls and other surfaces in the chamber. The process residues can flake off and contaminate the substrate. The residues may also interfere with the passage of radiation through the wall, for example, when a widow is provided on the wall and the residues deposited on the window attenuate the intensity of the radiation passing through the window. The radiation may be monitored by conventional process monitoring methods to determine completion of a process stage or reaching of an endpoint of a process. For example, such methods may include, without limitation, (1) plasma emission analysis in which an emission spectra of a plasma in a chamber is analyzed to determine a process endpoint, as disclosed in U.S. Pat. Nos. 4,328,068 and 5,362,256; (2) ellipsometry, in which a polarized light beam reflected from the substrate is analyzed to determine a phase shift and magnitude of the reflected beam, as disclosed in U.S. Pat. Nos. 3,874,797 and 3,824,017; and (3) interferometry, in which radiation reflected off the substrate is monitored as disclosed in U.S. Pat. No. 4,618,262; all of which are incorporated herein by reference in their entireties.

Thus, it is also desirable to reduce the deposition of process residue on the chamber surfaces, especially the surface of a wall or window in the chamber.

SUMMARY

The present invention provides an apparatus and method capable of satisfying these needs. In one aspect, the present invention comprises a substrate processing apparatus comprising a process chamber comprising a substrate support, gas inlet, gas energizer, gas exhaust, and a wall having a recess that is sized to reduce the t deposition of process residues therein.

In another aspect, the present invention comprises a substrate processing apparatus comprising a chamber having a support, gas inlet, gas energizer, and exhaust, and a wall, and means for reducing the formation of process residue on the wall, whereby a substrate held on the support may be processed by process gas introduced by the gas inlet, energized by the gas energizer, and exhausted by the exhaust.

In another aspect, the present invention comprises a method of processing a substrate in a chamber, the method comprising placing the substrate in the chamber, providing an energized gas in the chamber to process the substrate, and providing a recess in a wall of the chamber, the recess being adapted to reduce the formation of process residue therein.

In another aspect, a substrate processing apparatus comprising a process chamber comprising a substrate support, gas inlet, gas energizer, gas exhaust, and a wall comprising an internal surface, and a recess originating at the internal surface of the wall, the recess having an aspect ratio sized to reduce the deposition of process residues therein.

In a further aspect, a substrate processing apparatus comprising a process chamber comprising a substrate support, gas inlet, gas energizer, gas exhaust, and a wall having a recess that is sized to reduce the deposition of process residues therein; a magnetic field source adapted to maintain a magnetic field near the portion of the wall having the recess; and a process monitoring system capable of monitoring a process that may be conducted on a substrate in the process chamber through the recess in the wall.

In yet another aspect, a substrate processing apparatus comprising a process chamber comprising a substrate support, gas inlet, gas energizer, gas exhaust, and a wall having a recess that is sized to reduce the deposition of process residues therein; an electrical field source adapted to maintain an electrical field about the recess; and a process monitoring system capable of monitoring a process that may be conducted on in the process chamber through the recess in the wall.

In yet another aspect, a substrate processing apparatus comprising a process chamber comprising a substrate support, a gas inlet, a gas energizer, a gas exhaust, and a sidewall about the support, the sidewall having at least one recess sized to reduce the deposition of process residues therein.

In yet another aspect, the present invention comprises a method of processing a substrate in a chamber, the method comprising placing the substrate in the chamber, providing an energized gas in the chamber to process the substrate, providing a recess in a sidewall of the chamber, and passing radiation through the recess.

DRAWINGS

While the description, drawings, and appended claims below illustrate exemplary features of the invention, it is to be understood that each of the features can be used in the invention in general, not merely in the context of the particular drawings, and the invention includes any combination of these features.

FIG. 5b is a schematic top view of the wall of FIG. 5a;

FIG. 7b is a schematic top view of the wall of FIG. 7a;

FIG. 8b is a schematic top view of the wall of FIG. 8a;

DESCRIPTION

Figure 1A:
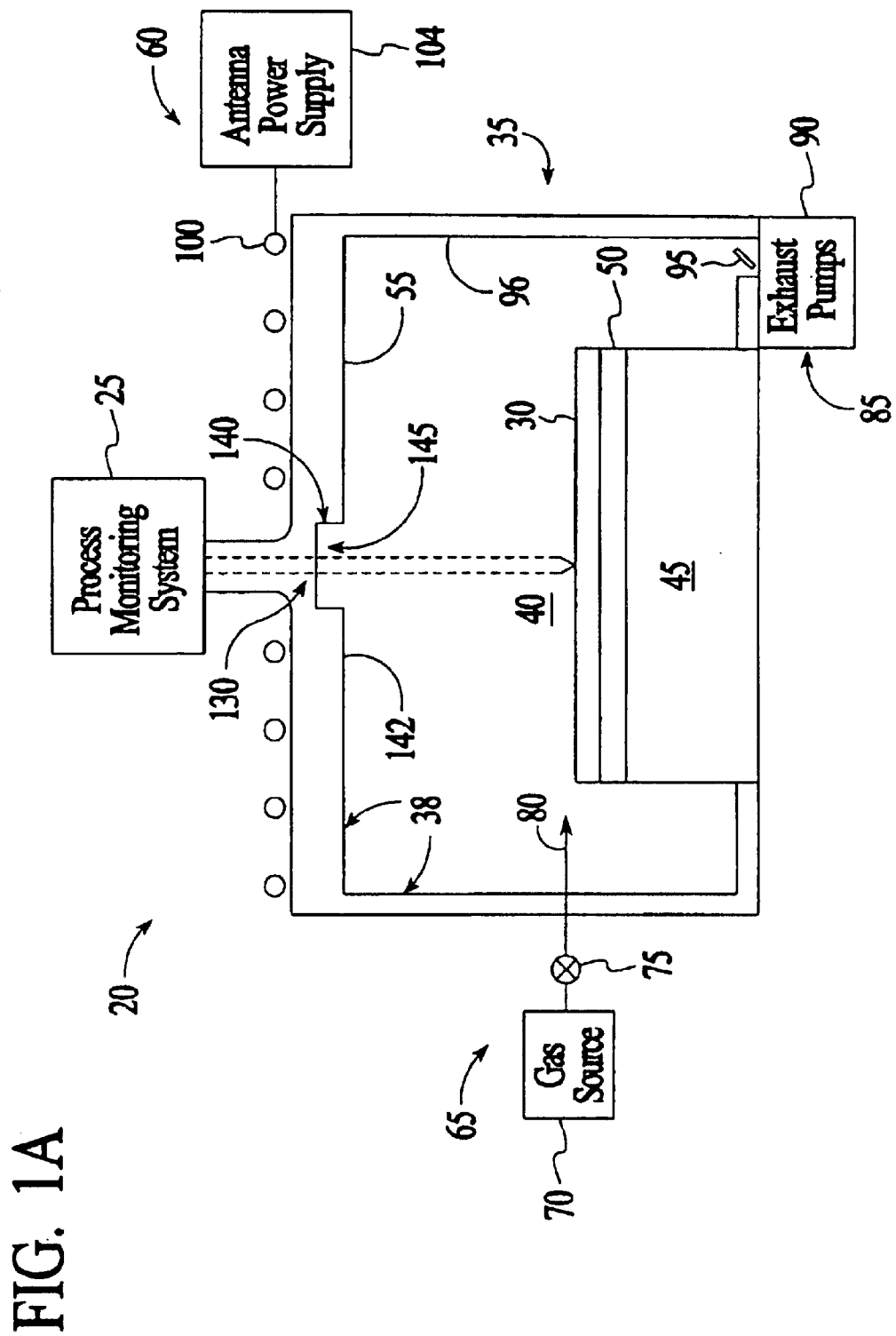
FIGS. 1a, 1b and 1c are schematic sectional views of exemplary embodiments of a chamber according to the present invention.

A substrate processing apparatus 20 is used to fabricate active or passive electronic devices on a substrate 30. In an exemplary embodiment, the apparatus 20 comprises a process chamber 35 having walls 38 that define a process zone 40 for processing the substrate 30, as for example, illustrated by FIG. 1a. The chamber walls 38 may be made from a metal or ceramic material or both. For example, the walls 38 may include a sidewall portion made from a metal, for example, aluminum, and a ceiling portion made from a ceramic, such as for example, one or more of $Al_2O_3$, $SiO_2$, AlN, BN, Si, SiC, $Si_3N_4$, $TiO_2$, $ZrO_2$ and mixtures and compounds thereof, for example, quartz. The process zone 40 contains a substrate support 45 for supporting a substrate 30, and which may include an electrostatic chuck 50 to electrostatically hold the substrate 30. Process gas is introduced into the process zone 40 through a gas supply 65 that includes a gas source 70, one or more flow control valves 75, and one or more gas inlets 80. Spent process gas and etchant byproducts are exhausted from the process chamber 35 via an exhaust system 85 which includes exhaust pumps 90, and a throttle valve 95 is provided to control the pressure of process gas in the process chamber 35.

A gas energizer 60 couples electromagnetic energy to the process gas to form energized and neutral gaseous species. The chamber embodiment of FIG. 1b represents a DPS-type chamber 35 from Applied Materials, Santa Clara, Calif. In this process chamber 35, the gas energizer 60 comprises an antenna 100 maintained adjacent to the ceiling 55 of the process chamber 35 to energize the process gas in the process zone 40 by inductively coupling energy to the process gas. At least a portion of the ceiling 55 is made from a material that is permeable to electromagnetic energy, such as a dielectric material, for example, aluminum oxide. Alternatively, or in combination, the process gas may be energized by capacitively coupling energy to the process gas by charging process electrodes such as the support 45 and sidewalls 96 around the substrate 30. In another chamber design (not shown), such as the IPS-type chamber also from Applied Materials, the ceiling 55 comprises a semiconducting material that serves as a process electrode for capacitively coupling RF energy into the process chamber 35. The frequency of the energy coupled to the process gas is typically from about 50 KHz to about 60 MHz. For example, an RF voltage at these frequencies may be applied to the inductor antenna 100 by an antenna power supply 104 at a (source) power level of from about 500 to about 2000 Watts to energize the process gas.

In yet another chamber design (not shown), a magnetic field may also be applied to the energized process gas by electron cyclotron resonance or by a magnetic field generator such as a magnet or electromagnetic coil, as for example, in the MxP-type chamber also from Applied Materials, and generally described in commonly assigned U.S. Pat. No. 4,842,683, issued Jun. 35, 1989, which is incorporated herein by reference in its entirety. The process gas may also be energized in a remote chamber (not shown) which is typically adjacent to the process chamber 35, as for example, in the MxP/RPS-type chamber, also from Applied Materials. The remote chamber is generally upstream from the process chamber 35 and that may comprise a gas energizer that couples electromagnetic energy to activate the process gas in the remote chamber. A suitable electromagnetic source (also not shown), comprises for example, a microwave applicator, a microwave tuning assembly, and a magnetron microwave generator.

Figure 2A:
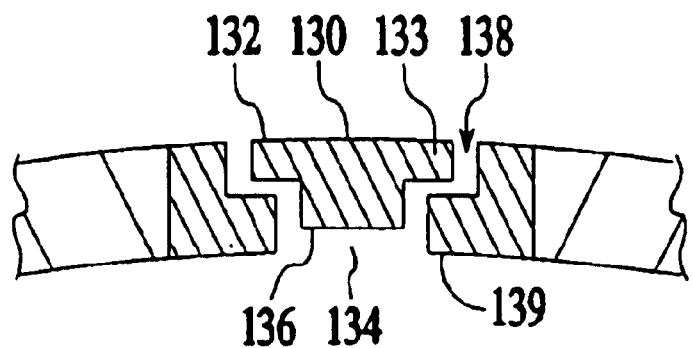
FIGS. 2a and 2b are schematic sectional views of chamber walls having a recessed portion.

A process monitoring system 25 may be used to monitor a process being performed in the process chamber 35 by for example, plasma emission analysis, ellipsometry, or interferometry. Typically, the process monitoring system 25 monitors the process through a radiation permeable portion of the wall 38. For example, the wall 38 may include a window portion 130 that allows certain types of radiation to pass therethrough. For example, the window 130 may be substantially permeable to ultraviolet, visible or infrared radiation that may be generated in the plasma or reflected from the substrate 30 or from a surface in the chamber 35. For example, when a process monitoring system 25 is provided to direct a radiation beam 148*a* from a radiation source 150 onto the substrate 30, and monitor the substrate reflected beam 148*b*, as illustrated in FIG. 2*a*, the window 130 is permeable to the radiation that is emitted by the radiation source 150 and reflected by the substrate 30. Thus, the window 130 may be made from a material substantially permeable to the radiation wavelengths or frequencies that are monitored by the process monitoring system 25. For infrared, visible, and UV radiation permability, the window 130 may be made of a ceramic, such as for example, one or more of $Al_2O_3$, Si, $SiO_2$, $TiO_2$, $ZrO_2$ or mixtures and compounds thereof. The ceramic may also comprise a monocrystalline material such as sapphire (monocrystalline alumina) that may exhibit erosion resistance in a halogen containing plasma, such as a fluorine containing plasma. Suitable sapphire windows may be obtained from Kyocera Ceramics, San Diego, Calif. Generally, the window 130 may comprise a polygonal, rectangular or circular shape. The surfaces of the window 130 may be polished smooth to reduce scattering of radiation passing through the window 130. For example, scattering of visible, ultraviolet and infra-red radiation is reduced when the window 130 has a surface roughness of less than about 1 $\mu$m.

Figure 1B:
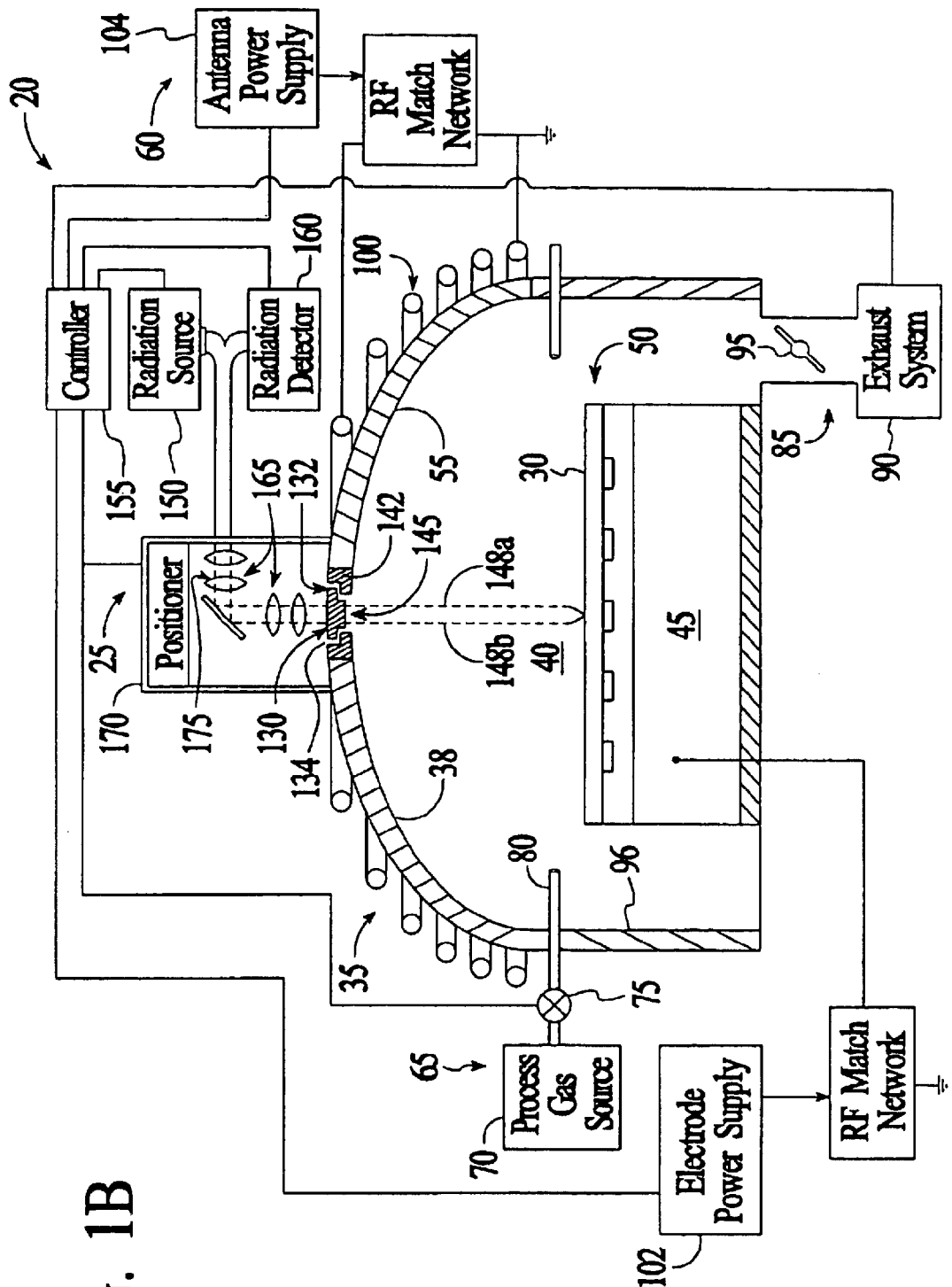

In the embodiment illustrated in FIG. 1*a*, the window 130 is an integral portion of the wall 38 of the chamber 35. The window 130 is positioned in the ceiling 55 directly above the substrate 30 and is shaped and sized to allow a radiation beam transmitted therethrough to be incident on the substrate 30 at an almost vertical incidence angle, i.e., at from about 85 to about 95 degrees, which may be used to observe a depth change of a trench being etched on the substrate 30. The window 130 may also be located at other portions of the wall 38, such as on a sidewall or at a different portion of the ceiling 55, such as for example, when the radiation evaluated is a emission spectra from a plasma in the chamber 35.

Figure 5A:
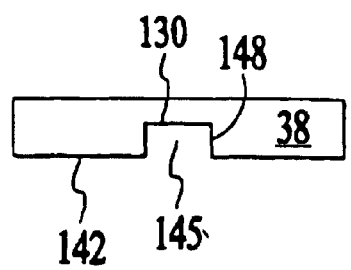
FIG. 5a is a schematic sectional view of a wall comprising a recessed masking portion and a window portion.
Figure 5B:
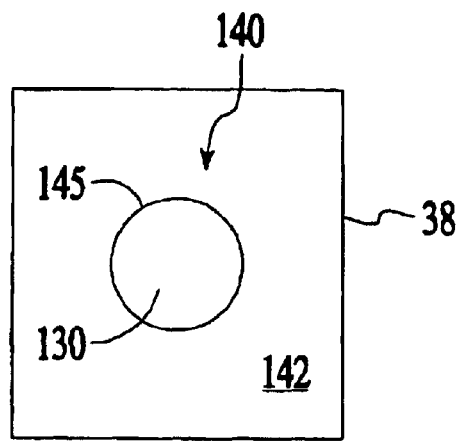

In one version of the present invention, the wall 38 comprises a recess 145 that originates at an internal surface 142 of the wall 38. The recess 145 may extend to or terminate at a window 130 in the wall 38, as illustrated in FIGS. 5*a* and 5*b*, or the recess may terminate at other structures or devices of the chamber 35. The recess 145 may be an aperture, trench or groove that extends through a portion or the entire thickness of the wall 38. The recess 145 may comprise a cross-sectional shape that is circular, polygonal, triangular, hexagonal, square or rectangular. For example, the recess 145 may comprise a passageway that allows radiation to pass between the process chamber 35 and the process monitoring system 25 while controlling access of energized gas species to the window 130 to reduce the formation of process residues on the window 130. In this version, the recess 145 is shaped and sized to allow a sufficient amount of radiation to pass therethrough to operate the process monitoring system 25 while still controlling the access of the energized gas species therein. For example, the recess 145 may be shaped and sized to pass both a line of sight incident radiation beam 148*a* and a line of sight reflected radiation beam 148*b* from a substrate 30, and for interferometric or ellipsometric analysis. The recess 145 may also be shaped and sized to monitor a spectral emission from the plasma, for example to perform a plasma emission analysis.

The aspect ratio of the recess 145 (ratio of depth to opening size) controls the access of ion and neutral gas species into the recess 145. For example, the depth of the recess 145 may be sized to control the distance that must be traveled by the gas species before they reach, for example, the window 130 in the recess 145. The opening size of the recess 145 may be sized to control the quantity of the gas species that enter into the recess 145. The recess 145 may also be sized to exclude the chamber plasma from entering the recess 145 by, for example, forcing sufficient sidewall recombination to extinguish the plasma before it reaches the window 130, the recess size depending upon the plasma sheath thickness. For example, fewer gas species pass across the depth of the recess 145 when the gas species collide with the recess sidewalls or otherwise combine with one another while passing through the passageway of the recess 145. It may be desirable to reduce the number of gas species that enter or travel through the recess 145 and/or it may also be desirable to allow some of the gas species to travel through the passageway to sputter or etch away the process residue deposits that form on the recess sidewalls 148 or window 130.

Thus, it is believed that the aspect ratio of the recess 145, which is the ratio of its depth to its opening size, may be sized to restrict entry of certain gas species (such as for example, neutral gas species that may form the process residues) while allowing other gas species (such as for example, charged or chemically active species that may assist in removing the process residues) to enter and travel through the recess 145, thereby controlling the type or quantity of the gas species that reach the window 130. In one embodiment, useful in the plasma etching of polysilicon, the recess 145 comprises an aspect ratio of at least about 0.25:1, and optionally, less than about 12:1. The aspect ratio may also be at least about 3:1 and less than about 7.5:1, for example, from about 4:1 to about 5:1. A recess 145 having such aspect ratios resulted in little or no deposition of process residue on its sidewalls 148 and very little deposition on the window 130 in the recess 145. However, smaller aspect ratios are useful in certain processes to selective filter out and prevent undesirable gas species from reaching the window 130, for example, aspect ratios of from about 0.25:1 to about 3:1, or from about 0.5:1 to about, 2.1.

Generally, it is believed that the presence of a recess 145 in front of the window 130 reduces the deposition of process residues on the window 130 by reducing the access of gaseous species that form process residues, (for example, neutral gaseous species which may be the residue forming species) or by allowing access of residue removing species (for example, highly energized gaseous ions that may etch away the process residues). Thus, the operation of the recess 145 may occur in different modes, depending on the aspect ratio, depth or opening size, of the recess 145, and the properties of the process being conducted in the chamber. For example, in a silicon etching process conducted at a gas pressure of from about 2 to about 10 mTorr, it is believed that two different mechanisms may be demonstrated. In a first mode, it is believed that the flux of residue forming gas species reaching the window 130 is reduced by means of multiple sidewall collisions and subsequent sticking of the gas species with the recess sidewalls 148. The recess 145 may also operate by excluding (if present) the plasma from entering the recess 145 by forcing sufficient sidewall recombination to extinguish the plasma before it reaches the window 130. A suitable recess 145 comprises an aspect ratio of at least 4:1 and a diameter of less than 10 times the plasma sheath thickness (if plasma is present). Increasing the aspect ratio may further reduce the already reduced process residue deposition rate on the window 130. In the process example, a recess 145 with an aspect ratio of about 5:1 with a hole diameter of about 4 mm would reduce the process residue deposition rate to less than 1% of that without the recess 145.

It is further believed that a second mode of operation of the recess 145 may occur when the size and aspect ratio of the recess 145 changes the balance of etching to deposition to produce a net removal of the process residues formed on the window 130. The second mode is useful when there are energized gas species present (such as from a plasma but a plasma is not required) which will etch away the process residues formed on the window 130. The specific size and aspect ratio of the recess 145 depends on the process. For example, a single recess 145 with an aspect ratio of 1.5 may be sufficient to produce a net etching of process residues on an inside window 130. For such an aspect ratio, an array of recesses 145 may also be used to provide a large line of sight area of the substrate 30. To maximize the transmission of line of sight radiation reflected from the substrate 30 or a chamber wall, the array of recesses 145 may be non-circular holes, such as hexagons in a hexagonal close-packed array, or squares in a square array, and with reduced wall thickness between the recesses 145, as for example, shown in FIG. 8b.

The depth or opening size of the recess 145 may be selected independently of one another or in relation to a preselected aspect ratio. For example, an optimized depth d may also depend upon the gas flow rate, gas pressure or even gas composition, because it is related to the length of the mean free path of the gas species, their molecular sizes, and their reactivity. For example, for a silicon etching process conducted at a gas pressure of about 1 to about 1000 mTorr, an optimized recess depth d may be from about 0.5 to about 500 mm or even from about 10 to about 50 mm. The opening size of the rib recess 145 may have a linear dimension, such as a width for rectangular or parallelogram recesses, or may have a circular dimension, such as a diameter for round holes. The opening size of the recess 145 is typically from about 0.1 to about 50 mm.

Figure 6A:
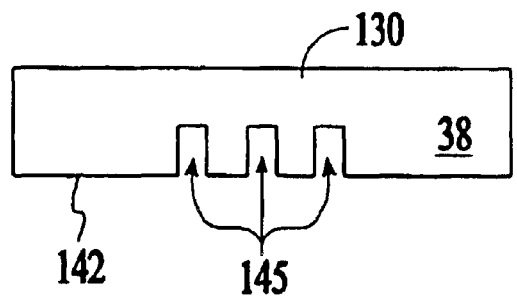
FIGS. 6a to 6c are schematic sectional views of exemplary embodiments of walls comprising masking portions having multiple recesses.
Figure 6B:
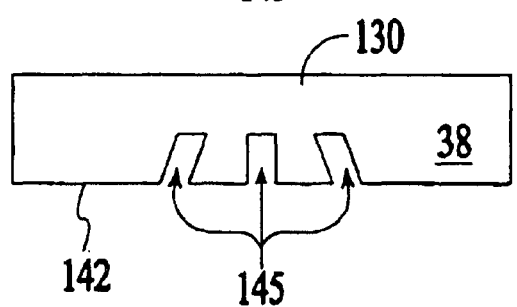
Figure 6C:
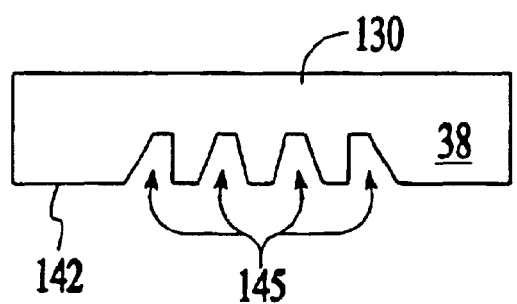

The passageway through the recess 145 may be positioned vertically relative to a processing surface of the substrate 30, as shown for example in FIG. 6a, or at an inclined angle relative to an internal surface of the chamber 35, as shown for example in FIGS. 6b and 6c. The passageway angle relative to the primary direction of travel of energized gas species also controls the access of the energized gas species into the recess 145 and to the optional window 130. For example, the recess 145 may be angled so that its longitudinal or central axis is along the direction of travel of the energized species. The recess 145 may also be oriented at an inclined angle relative to the plane perpendicular to the substrate 30, as in FIGS. 6b and 6c, for example, at an angle of less than about 90 degrees or for example from about 60 to about 90 degrees, or from about 70 to about 88 degrees, and in one embodiment about 80 degrees. The inclined angled recess 145 may also be used to selectively pass through line of sight radiation that is reflected from the substrate 30 or radiation that originates from a particular region of the plasma.

In another version, a plurality of recesses 145 may be arranged to pass radiation reflected from one or more different regions of the substrate 30 or portions of the plasma in the chamber 35. For example, one recess 145 may be inclined at an angle of 70 degrees, another at an angle of 80 degrees, and yet another at an angle of 90 degrees. This would allow monitoring of a line of sight (to the substrate or to a portion of the plasma) through one or more of the recesses 145, providing desired flexibility in selection of the appropriate process monitoring region.

Figure 1C:
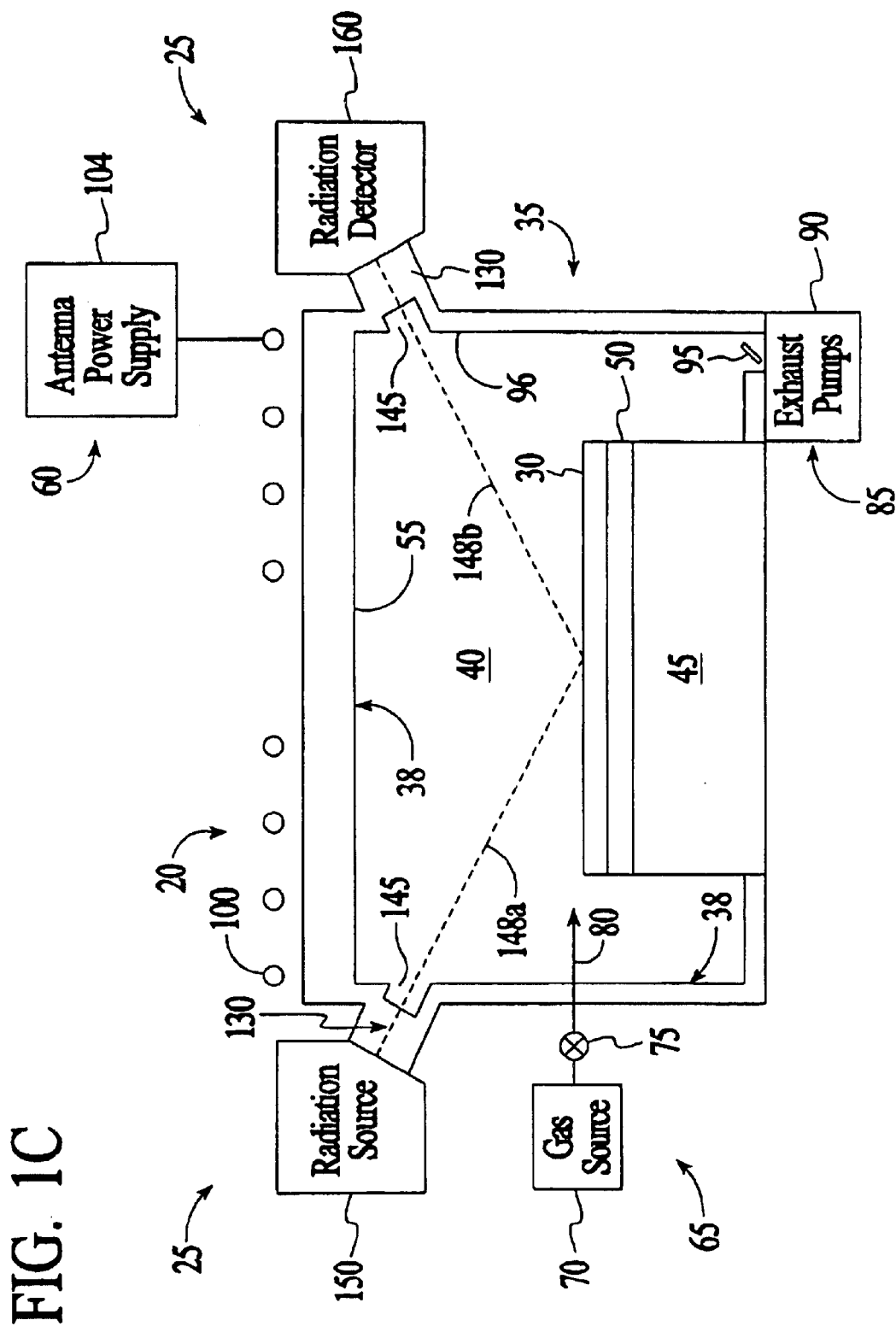

In another version, one or more windows 130 may be provided in a sidewall 96 of the chamber 35. In the version illustrated in FIG. 1c, for example, two windows 130 are provided in sidewalls 96 on generally opposite sides of the chamber 35. In this version, the process monitoring system 25 may comprise a radiation source 150 to provide a radiation beam 148a through one of the windows 130 to be incident on the substrate. Through the other window 130 the reflected radiation beam 148b from a substrate 30 may be detected by radiation detector 160 for interferometric or ellipsometric analysis. Alternatively or additionally, a window 130 in the sidewall 96 may be shaped and sized to monitor a spectral emission from the plasma, for example to perform a plasma emission analysis. As shown in FIG. 1c, one or more of the windows may comprise a recess 145 of the type discussed above. The window 130 and/or the recess 145 may be inclined relative to the sidewall 96 at an angle of from about 5 degrees to about 85 degrees, more preferably from about 60 degrees to about 70 degrees, depending on the dimensions of the chamber 35 and the desired incident angle of the radiation beam 148a.

Figure 2B:
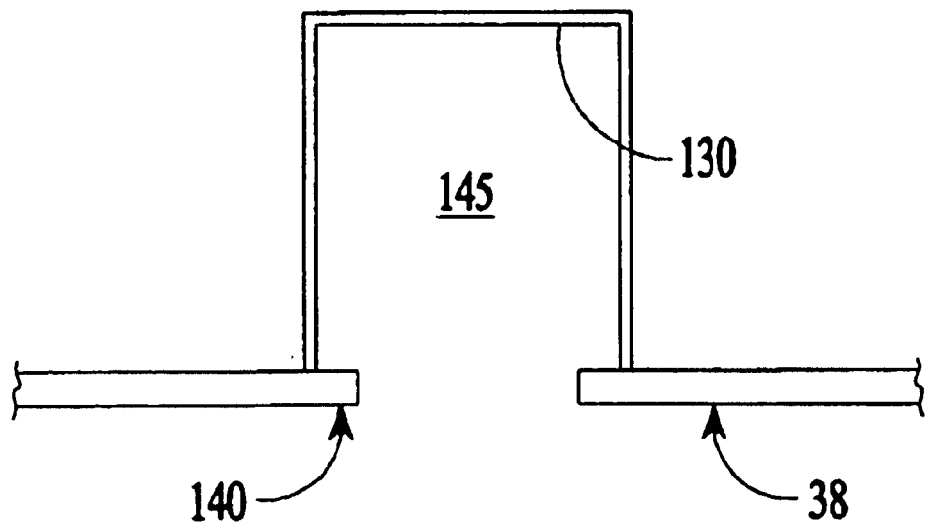

Instead of being integral with the wall, the window 130 may also comprise a separate structure positioned on the ceiling 55, as for example shown in FIG. 2a. In this embodiment, the window 130 comprises a plug 132 of radiation permeable material sized to fit a matching aperture 134 in the ceiling 55. For example, the plug 132 may comprise a disc 133 with an outwardly extending post 136 whish is smaller than the depth of the aperture 134. The disc 133 is sized to rest on a circular ledge 138 that extends out of the ceiling 55 and a seal 139 may be formed between the disc 133 and the circular ledge to contain the gaseous environment in the chamber 25. The top of the post 136 and the surrounding sidewalls of the aperture 134 define the recess 145 in the wall 38, as shown in FIG. 2b. This embodiment is advantageous because the plug 132 may be replaced when eroded, may be removable for cleaning, or may be changed for monitoring different processes.

Figure 3:
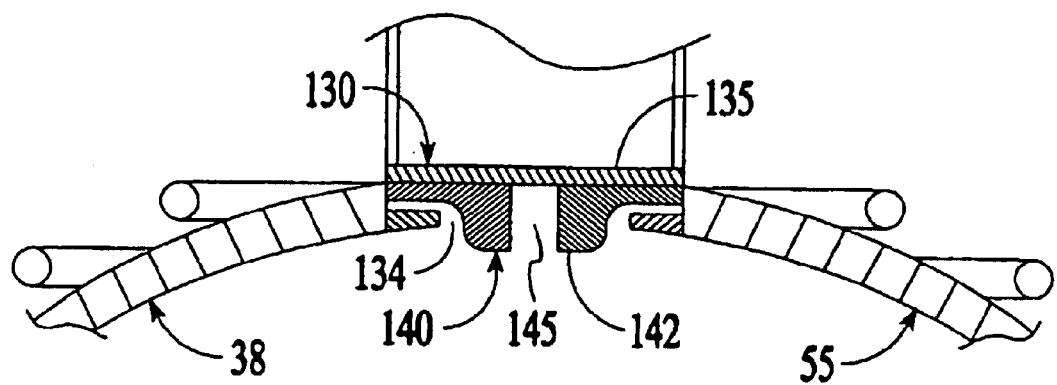
FIG. 3 is a schematic sectional view of a separable masking portion comprising a recess and covering a window in a chamber wall.
Figure 4:
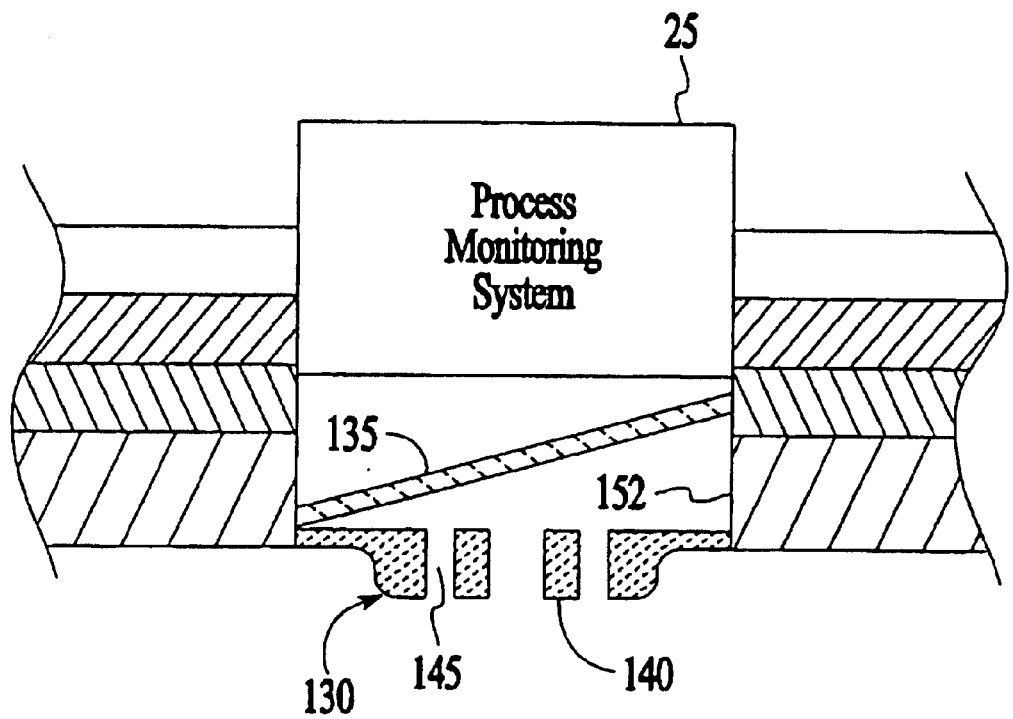
FIG. 4 is a schematic sectional view of another embodiment of a masking portion having a recess over a window and showing a process monitoring system.

In another embodiment, the wall 38 comprises a mask or masking portion 140 (used interchangeably herein) that is discrete and separate from the wall 38 as shown in FIGS. 3 and 4, or that is integral with the wall 38 as shown in FIGS. 5a,b and 6a–c. By mask or masking portion 140 it is meant a structure, which may be part of the wall 38, part of the window itself, or a separate structure, that serves to reduce the formation of process residues on the window 130. In the example of FIG. 3, the window an 130 comprises a plate 135 that is mounted over an aperture 134 in the ceiling 55 of the chamber 35, and is made from a radiation permeable material as described herein. The overlying masking portion 140 has at least one recess 145 extending therethrough. The masking portion 140 covers the surface of the plate 135 that would otherwise be exposed in the chamber 35 so that radiation may pass through the recess 145 and the window 130 while reducing the deposition of process residue and byproducts on the window 130. The masking portion 140 may be made of a material that is resistant to erosion by the process gas or plasma in the chamber 35, such as a plasma resistant material, for example, one or more of $Al_2O_3$, $SiO_2$, AlN, BN, Si, SiC, $Si_3N_4$, $TiO_2$ and $ZrO_2$; or may be the same material as the window 130 or the wall 38.

Such a masking portion 140 and recessed window 130 have been found to reduce the rate of formation of etchant residues during polysilicon etching to about 3 to about 10 Å/hr, which is about 100 times lower than the rate measured for unprotected windows of about 0.03 to 0.1 microns/hour. In addition, the masking portion 140 may also protect the window 130 from erosion by chemically reactive process gases to extend the lifetime of the underlying window 130. The reduced deposition of process residue on the window 130 provides a higher signal to noise ratio of the process monitoring systems 25 and more accurate and reliable radiation readings even after processing of a large number of substrates 30 in the chamber 35. If a plasma resistant window material is used, such as sapphire, the aspect ratio can be chosen so that little or no residue forms on the window 130, allowing the window 130 to be used many times without cleaning. A more accurate process monitoring method allows the deposition or etching of thinner films on the substrate 30. In addition, the chamber utilization efficiency and substrate throughput may be increased because the process chamber 35 does not have to be frequently opened to clean the surface of the window 130.

The window 130 may also comprise a radiation permeable plate 135 that is mounted at an angle relative to the plane of the substrate 30, or relative to the angle of incidence of reflected radiation onto the plate 135, as shown in FIG. 4. The tilt angle of the window 130 reduces the reflection of radiation passing through the window 130 that originates from the radiation source or is reflected from the substrate 30. A suitable tilt angle may be at least about 2 degrees, and preferably less than about 15 degrees. The plate 135 may be tilted at an angle by elevating a side or edge of the plate 135 relative to the opposing side/edge, for example, by providing a step 152 below the plate 135. In one ah embodiment, the step 152 was sized from about 0.5 mm to about 5 mm.

Figure 7A:
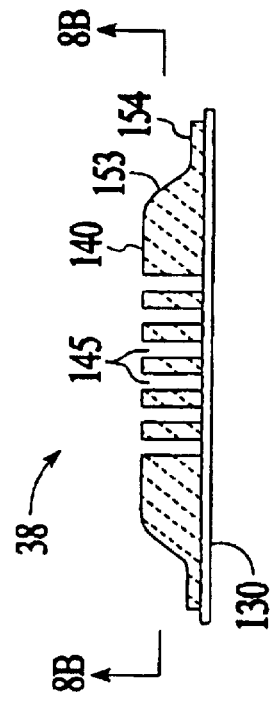
FIG. 7a is a schematic sectional view of another embodiment of a wall having a masking portion with an array of recesses with one or more diameters.
Figure 7B:
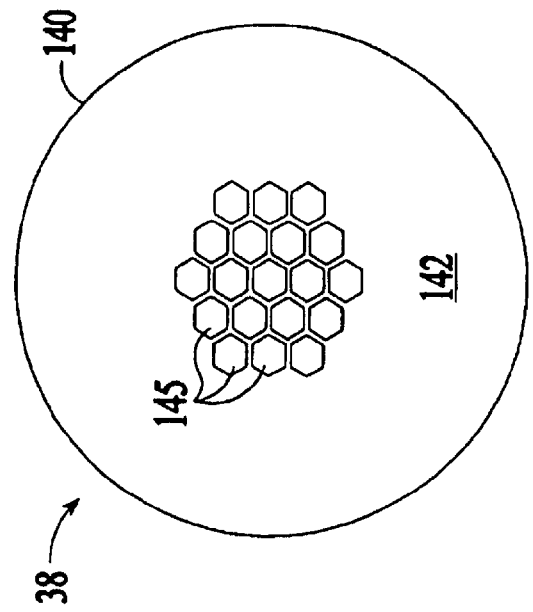

The masking portion 140 of the wall 38 may also comprise a plurality of recesses 145. For example, the array of recesses 145 shown in FIGS. 7a and 7b, comprise a cumulative opening area that is sufficiently large to allow a suitable intensity of radiation to pass through. The recesses 145 may also be spaced apart to allow a source radiation beam 148a to be scanned across the surface of the substrate 30 or positioned over a particular feature such as a via, trench, or flat portion of the substrate 30. For example, in a chamber 35 that is used to process 300 mm wafers, the wall 38 may comprise an array of recesses 145 that have a total cumulative opening area of from about 200 to about 2000 $mm^2$ (0.3 to about 3 $in^2$), and more preferably from about 400 about 600 $mm^2$ (0.6 to about 0.9 $in^2$). The actual size, number and arrangement of recesses 145 depends upon the chamber size and geometry, the substrate diameter, the process being performed, and the requirements of the process monitoring system 25. In an embodiment useful for interferometric process monitoring systems 25, the masking portion 140 may comprise, for example, an array of about 3 to about 800 recesses or from about 7 to about 200 recesses, and the recesses 145 may be spaced apart by about 0.25 to about 15 mm.

The array of recesses 145 may also be arranged in a showerhead configuration with each recess 145 being shaped, for example, as a cone with the walls of the recesses 145 abutting one another, as shown in FIG. 6c. The array of recesses 145 may be disposed or oriented to view a wide area of the substrate 30 in interferometric or ellipsometric analysis, or one or more preselected regions of the plasma in plasma emission analysis. The array may also comprise different sized recesses 145, for example, a first recess 145a located above a central portion of the window 130 and having a diameter of, for example, 3.5 to 5 mm; and a plurality of second recesses 145b located above a peripheral portion and having a diameter of, for example, 2 to 3 mm, as for example, shown in FIG. 7b.

Figure 8A:
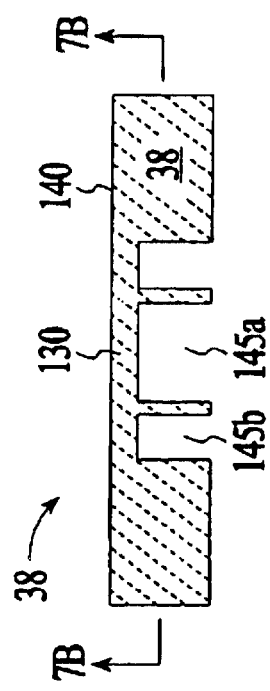
FIG. 8a is a schematic sectional view of another embodiment of a wall having a masking portion with an array of hexagonal recesses.
Figure 8B:
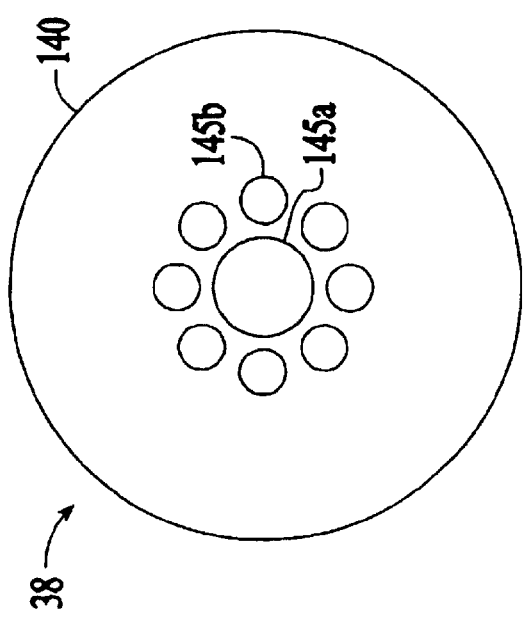

In yet another embodiment, the recesses 145 comprise hexagonal openings and they are closely spaced, for example, as illustrated in FIGS. 8a and 8b. In this embodiment, the recesses 145 are in a masking portion 140 shaped as a right cylinder and sized to cover substantially the entire exposed portion of a disc-shaped window 130. In this version, the masking portion may comprise a separate structure made of aluminum oxide. In the embodiment shown, the masking portion 140 comprises a raised pedestal 153 having a surrounding annular lip 154. The raised pedestal 153 may have a thickness of from about 0.5 mm to about 500 mm, a diameter of from about 50 mm to about 200 mm, and a rounded corner to reduce plasma erosion. The annular lip 154 may be sized to allow the masking portion to be easily attached to the chamber 35 and its thickness may be from about 0.5 mm to about 10 mm.

Figure 9A:
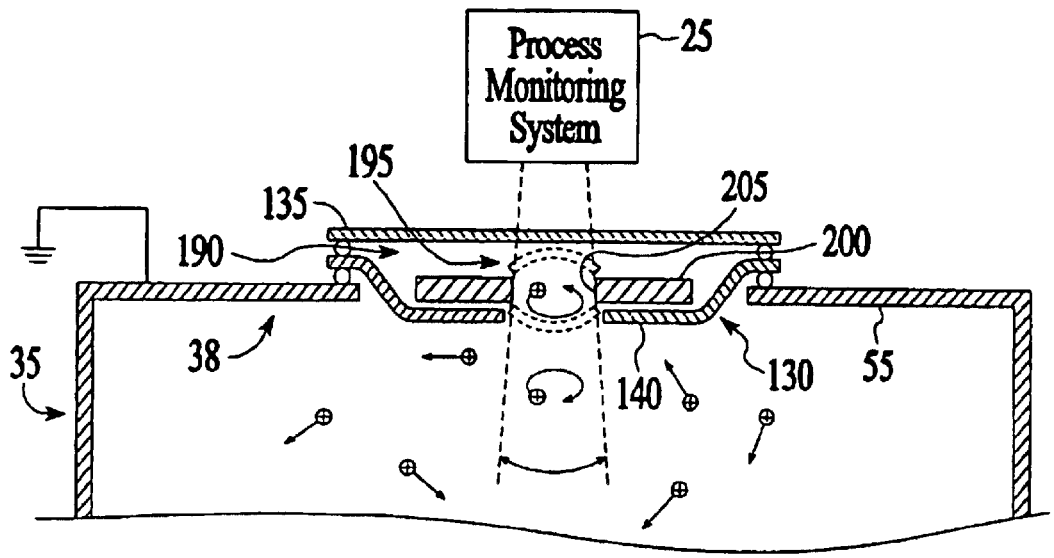
FIG. 9a is a schematic sectional partial view of a chamber having an electromagnetic field source to maintain a magnetic field about across a window in the chamber.
Figure 10A:
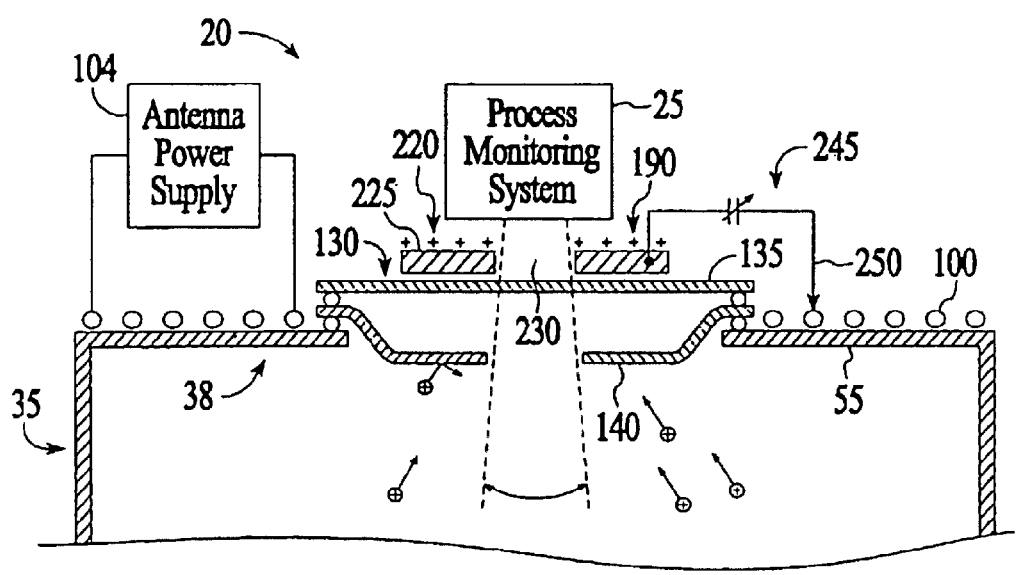
FIG. 10a is a schematic sectional partial view of a chamber comprising an electromagnetic field source to maintain an electrical field across a window in the chamber.

In another embodiment of the present invention, as for example, schematically illustrated in FIGS. 9a and 10a, the process chamber 35 comprises an electromagnetic field source 190 adapted to provide an electromagnetic field or energy about and near a portion of the wall 38, for example, about the recess 145, and optionally, about the window 130. When a substrate 30 held on the support 45 is processed by the energized process gas, the electromagnetic field about the wall 38 reduces the deposition of process residues on the wall 38, in the recess 145, or on the window 130.

For example, in the embodiment shown in FIG. 9a, the electromagnetic field source 190 may comprise a magnetic field source 195 adapted to maintain a magnetic field near the portion of the wall 38, about the recess 145, or across the window 130. The magnetic field source 195 comprises at least one magnet 200 or electromagnet (not shown) positioned adjacent or abutting to the wall 38, recess 145, or window 130 to provide magnetic energy thereabout. The magnetic field source 195 may provide a magnetic field that is preferentially concentrated across the recess 145 or window 130 relative to other portions of the chamber 35. For example, the magnetic energy (as represented by the magnetic field lines) may be confined to a space about the recess 145 or window 130, and it may also penetrate only a small distance into the chamber 35.

The magnetic energy may be applied to control entry of gas species into the recess 145 or access of the gas species to the window 130. For example, the magnetic energy may have magnetic field components which are provided parallel to the plane of the wall 38 or the window 130 to confine or repel charged plasma ions and electrons of the plasma away therefrom and thereby reduce or prevent the deposition of process residues from these gas species on the wall 38 or window 130. It is believed that a magnetic field having a component in the plane parallel to the wall 38 or window 130 may cause charged ions and electrons within this region to rotate in a circular motion about this region and thus prevent them from reaching the wall 38 or window 130. The actual magnetic strength depends upon the window size, energy of the plasma ions, and other factors. However, a suitable magnetic field strength is from about 10 to about 10,000 Gauss or even from about 50 to about 2000 Gauss.

Figure 9B:
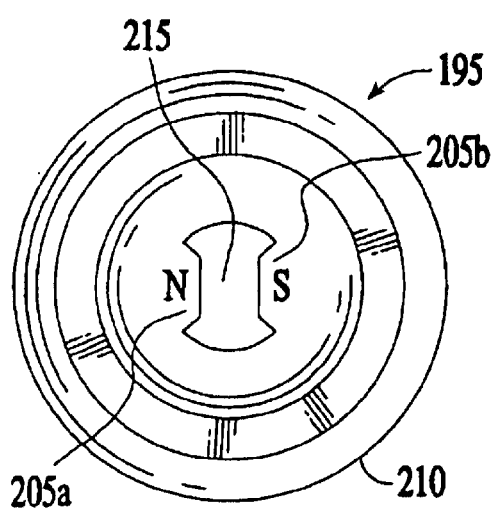
FIG. 9b is a schematic top view of an electromagnetic field source comprising a magnet having facing magnetic poles.
Figure 9C:
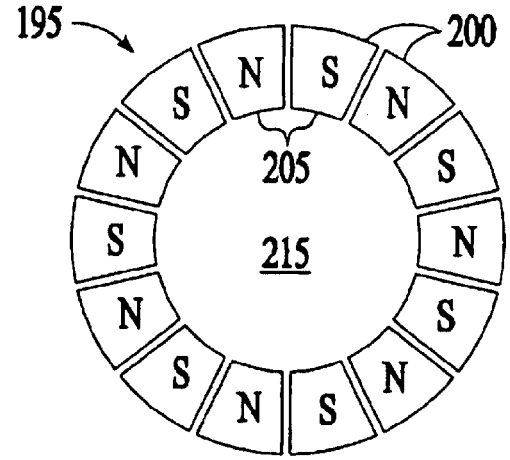
FIG. 9c is a schematic top view of another electromagnetic field source comprising a plurality of magnets.

In the embodiment illustrated in FIG. 9a, the magnetic field source 195 comprises a plurality of magnetic poles 205 disposed about a perimeter of the window 130 and having opposing magnetic polarities facing one another, such as facing north and south poles 205a,b. In another embodiment, shown in FIG. 9b, the magnetic field source 195 comprises a magnetic yoke 210, typically a ferromagnetic material having magnetic poles 205a,b which are oriented to maintain a magnetic field across an aperture 215. The magnetic yoke 210 comprises a pair of radially extending poles 205a,b that face one another with opposing magnetic polarity. Alternatively, as shown in FIG. 9c, the magnetic field source 195 may comprise a plurality of magnets 200 having magnetic poles 205 facing one another across an aperture 215 sized to allow radiation to pass through the window 130 to operate the process monitoring system 25. The aperture 215 may be circular, triangulated or rectangular; however, a circular opening generally provides good axial symmetry for the magnetic field source and smooth internal surfaces that are often less susceptible to erosion by the plasma.

In another embodiment, as illustrated in FIG. 10a, the electromagnetic field source 190 comprises an electrical field source 220 that provides electrical energy about the wall 38, recess 145 or across the window 130 to maintain an electrical field thereabout. The electrical field may be adapted to reduce deposition of process residues on the wall 38, in the recess 145, or on the window 130, for example, by repelling the charged residue forming gas species or by causing energized gas species to impinge upon and bombard the window 130 to etch away the process residues. The electric field source 220 may comprise an electrode 225 that is adjacent to, abutting, or behind the wall 38, about the recess 145, or near the window 130, to couple electrical energy thereabout. The electrical field may be adapted to have electrical field components which are parallel or perpendicular to the plane of the wall 38 or window 130. The electrode 225 may be sized sufficiently large to provide an electric field that covers the entire area of the wall 38 or only the window 130. A voltage source 245 electrically biases the electrode 225 with a DC, AC or RF voltage. As shown in FIG. 10a, the voltage source 245 may be an electrical tap 250 connecting a selected coil of the inductor antenna 100 to the electrode 225. Thus, the antenna power supply 104 may be used to power both the electrode 225 and the inductor antenna 100, or bias the electrode 225 with a voltage of from about 10 to about 10,000 volts, and more preferably from about 20 to about 4000 volts.

Figure 10B:
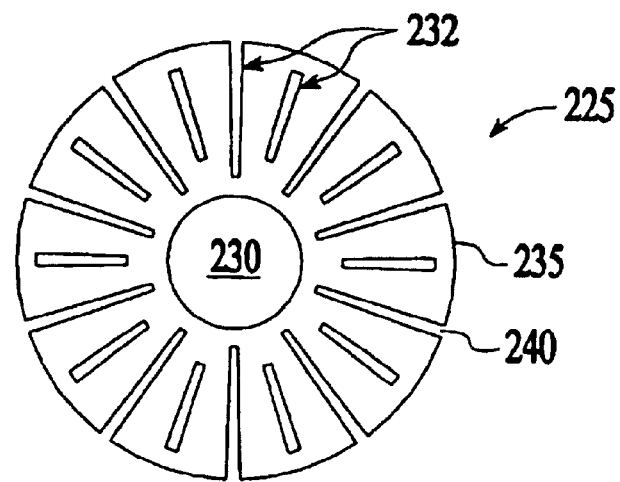
FIGS. 10b to 10d are schematic top views of different embodiments of electrodes that may be used maintain an electrical field across a window.
Figure 10C:
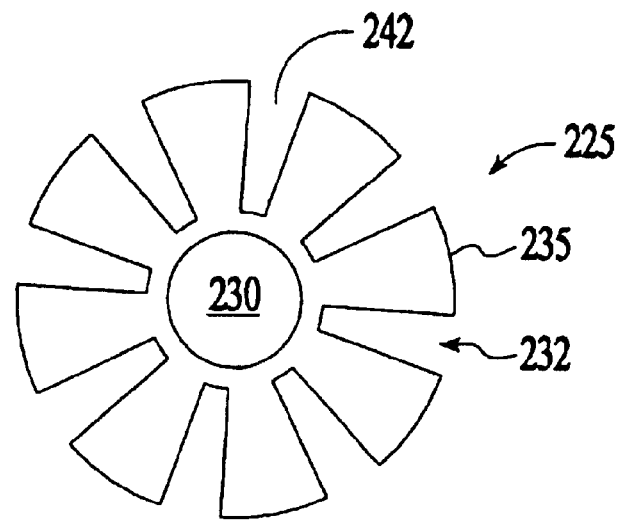
Figure 10D:
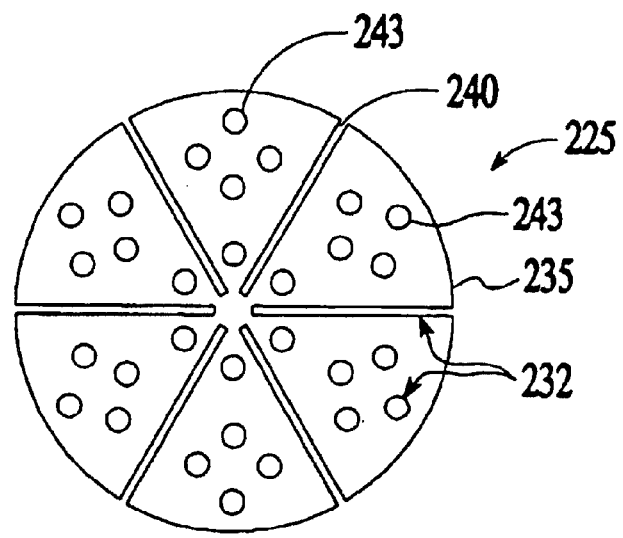

The electrode 225 may also comprise eddy current reducing slots 232 that are shaped and sized to reduce any eddy currents that may be induced in the electrode 225. The eddy currents may occur due to the coupling of electrical energy to the electrode 225 from other process components, such as the inductor antenna 100. The eddy current reducing slots 232 impede a flow path of eddy current in the electrode 225. For example, in the embodiment shown in FIG. 10b, the electrode 225 comprises a disc 235 having eddy current slots 232 comprising one or more radial cutouts 240 that impede circular eddy currents. In other embodiments, in FIGS. 10c and 10d, the eddy current slots 232 comprise a series of wedge-shaped cuts 242 or an array of circular holes 243 and slots 240 which are spaced apart from one another.

Figure 10E:
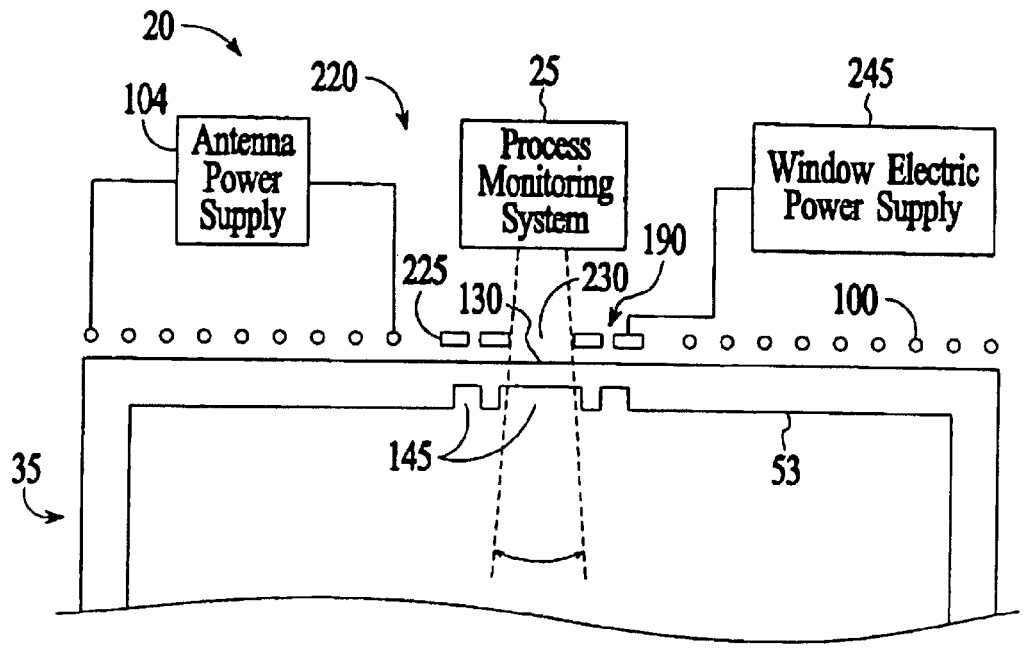
FIGS. 10e and 10f are schematic partial sectional views of chambers having different electrode embodiments.
Figure 10F:
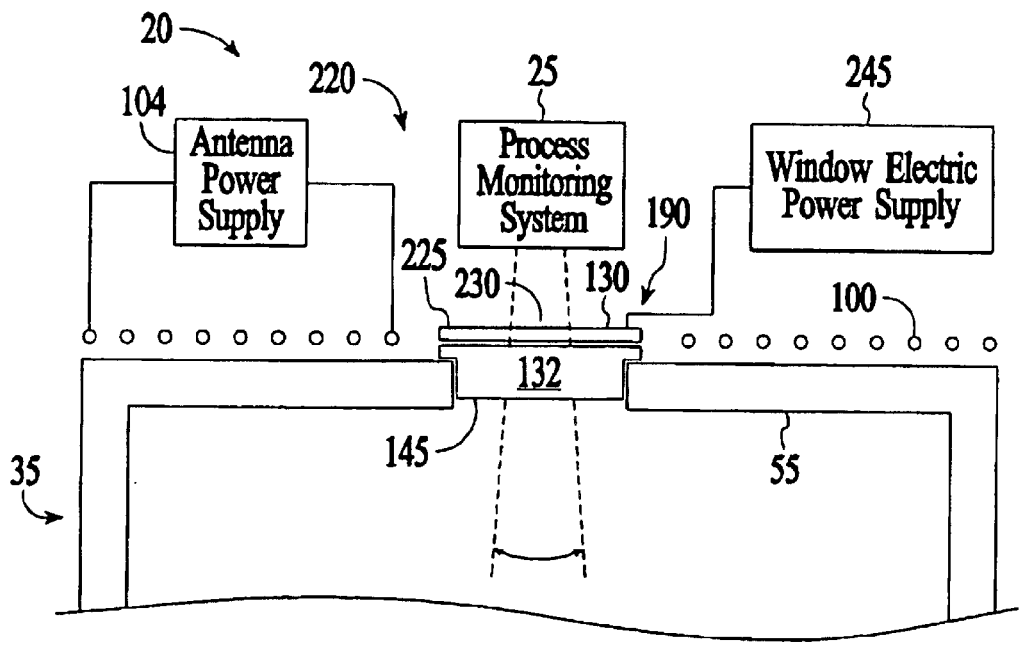

It should be noted the afore-described recess 145 or masking portion 140 may also be used in combination with either version of the electromagnetic field source apparatus 190. For example, a masking portion 140 having the recess 145 may be aligned over an aperture 215 in a magnetic yoke 210 or over an aperture 230 in an electrode 225, so that the recess 145 is aligned to the apertures 215 or 230. For example, FIG. 10e illustrates a wall 38 comprising a recess 145 which is sized and distributed to match the apertures 230 in the electrode 145. As another example, FIG. 10f illustrates an embodiment in which the electrode 225 abuts a large recess 145 defined by a window 130 comprising a radiation permeable plug 132.

Operation of an exemplary process chamber 35 according to the present invention having a wall 38, a recessed window 130, and a process monitoring system 25, will now be described with reference to FIG. 2. In this example, the process monitoring system 25 comprises an interferometric system that evaluates a property of a substrate reflected radiation beam 148b, such as its intensity, to determine the endpoint of the etching process. The process monitoring system 25 comprises a radiation source 150 that may be outside or inside the chamber 35 to provide a source of radiation in the chamber 35. The radiation source 150 may comprise, for example, an emission from a plasma generated inside the chamber 35 which is generally multi-spectral and provides radiation having multiple wavelengths across a spectrum. The radiation source 150 may also be positioned outside the chamber 35 so that an incident radiation beam 148a from the source 150 may be passed through the window 130 and recess 145 and into the chamber 35. The external radiation source 150 may provide radiation such as ultraviolet (UV), visible or infrared radiation; or may provide other types of radiation such as X-rays. In one embodiment, the radiation source 150 provides radiation having a predominant wavelength, such as a monochromatic radiation having primarily radiation at a single or a few wavelengths, for example, a He—Ne or Nd-YAG laser.

In another embodiment, the radiation source 150 provides polychromatic radiation which may be selectively filtered to provide substantially only a single wavelength. For example, suitable radiation sources 150 for providing polychromatic radiation include a plasma emission in the chamber, mercury discharge lamps that are capable of generating a polychromatic radiation spectrum having wavelengths in a range of from about 180 to about 600 nanometers; arc lamps such as Xenon, Hg—Xe and tungsten-halogen lamps; and radiation emitting diodes, such as LEDs. The polychromatic radiation source 150 may be filtered to provide an incident radiation beam 148a having selected frequencies, particular plasma emission spectra wavelengths can be used, or color filters (not show) can be placed in front of a radiation detector 160 to filter out undesirable wavelengths prior to measuring the intensity of the reflected radiation beam 148b entering the radiation detector 160. Also, the incident radiation beam 148a may comprise non-polarized radiation because the polarization state of a polarized radiation may be altered by process residues formed on the process window 130. However, a deposition free window 130 as described herein would allow the use of polarized light because little or no process residues would be formed on the window 130.

The radiation source 150 may be also adapted to direct a radiation beam 148a, such as a laser beam at nearly a right angle relative to the surface of the substrate 30, i.e., at an angle of close to 90° to measure etching of features having a high aspect ratio, which may otherwise be blocked from a radiation beam directed at low or acute angle onto the substrate 30. Typically, one or more convex focusing lenses 165 are used to focus a radiation beam 148a from the radiation source 150 into a collimated beam that is directed onto the substrate surface and/or to focus reflected radiation 148b back from the substrate 30 to the radiation detector 160. Generally, the area of the incident beam spot is large (relative to the size of the features) to compensate for variations in surface topography of the substrate 30 for example in the etching of high aspect ratio features having small openings, such as vias or deep narrow trenches; however, it may also be small to focus the beam incident spot onto particular features of the substrate 30.

Optionally, a positioner 170 may be used to move the incident radiation beam 148a across the substrate surface to locate a suitable portion of the substrate being processed on which to "park" the beam spot to monitor processing of the substrate 30. Typically, the radiation beam positioner 170 comprises one or more primary mirrors 175 that rotate at small angles to deflect the incident radiation beam 148a from the radiation source 150 onto different positions of the substrate surface, and to receive the reflected radiation beam 148b and focus it on the radiation detector 160. In another embodiment, the positioner 170 scans the source radiation beam 148a in a raster pattern across the substrate surface during processing. For example, the beam positioner 170 may comprise a scanning assembly consisting of a movable stage (not shown), upon which the radiation source 150, focusing assembly, collecting lens, and detector 160 are mounted. The movable stage may be moved through set intervals by a drive mechanism, such as a stepper motor, to move the incident beam spot across the substrate surface.

The radiation detector 160 comprises an electronic component having a radiation sensitive surface which provides a signal in response to the intensity of the reflected radiation 148b. In interferometry, the reflected radiation 148b undergoes constructive and/or destructive interference to provide an intensity that fluctuates as the thickness of the layer being processed or the depth of trench being etched on the substrate 30 increases or decreases, respectively, and the radiation detector 160 provides an electrical output signal in relation to the measured intensity of the reflected radiation 148b. The detector 160 comprises a radiation sensor, such as a photovoltaic cell, photodiode, photomultiplier, or phototransistor, which provides an electrical output signal in response to a measured intensity of the reflected radiation 148. The detector signal can comprise a change in the level of a current passing through an electrical component or a change in a voltage applied across an electrical component. The detector may comprise a photomultiplier (PMT), such as those commercially available from Hamamatsu, Japan.

A controller 155 receives the signal from the radiation detector 160, evaluates the signal relative to calculated values, using an algorithm, or from stored values, and changes process conditions in the process chamber 35 in relation to the evaluated signal or according to programmed guidelines. For example, upon detection of a process endpoint, the controller 155 may change first process conditions to second process conditions to change a rate of etching of a layer on the substrate 30 before the entire layer is etched through, or to stop the etching process. The etch rate may be reduced by changing the composition of the process gas to reduce the content of the more chemically reactive etchant gases, the RF energy coupled to the process gas may be lowered, or the substrate temperature may be lowered. A typical controller 155 comprises a computer comprising one or more central processor units (CPUs) interconnected to a memory system with peripheral control components, such as for example, a PENTIUM microprocessor, commercially available from Intel Corporation, Santa Clara, Calif. The CPUs can also comprise ASIC (application specific integrated circuits) that operate a particular component of the process chamber 35. The interface between an operator and the computer controller 155 can comprise a CRT monitor and a radiation pen (not shown), or other devices, such as a keyboard, mouse or pointing communication device. A computer program or computer instructions may be used to operate the controller.

To perform the process, a substrate 30 is transferred by a robot arm (not shown) from a load-lock transfer chamber (not shown) through a slit valve and into the process zone 40 of the process chamber 35, and placed on the support 45 where it is held by an electrostatic chuck 50. Optionally, a heat transfer gas is supplied below the substrate 30 to control the temperature of the substrate 30. Thereafter, the process conditions in the process chamber 35 are set to process the layer on the substrate 30 the process conditions comprising one or more of process gas composition and flow rates, power levels of a gas energizer 60, gas pressure, and substrate temperature. The process can also be performed in multiple stages, for example, each stage having different process conditions. For example, in an etching process, an energized process gas capable of etching the substrate 30 is energized and maintained at process conditions suitable for etching the substrate 30 in the process chamber 35. Suitable process gases for etching layers on the substrate 30, include for example, HCl, $BCl_3$, HBr, $Br_2$, $Cl_2$, $CCl_4$, $SiCl_4$, $SF_6$, $F_2$, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, He, and mixtures thereof. By energized process gas, it is meant that the process gas is activated or energized so that dissociated, non-dissociated, ionic and neutral species may be excited to higher energy states. Also, initially, a reflectance machine may be used to determine the initial thickness of the layer to be etched on the substrate 30, such as a model UV1050 available from KLA-TENCOR, Santa Clara, Calif. The actual layer thickness may be used to estimate the overall operation time of the etching process and/or to calculate the thickness of the layer that should be etched to provide a predetermined thickness of layer that remains on the substrate 30 after the etching process.

EXAMPLES

The following examples demonstrate the principles of the present invention; however, the invention may be used in other applications as would be apparent to those skilled in the art, and the scope of the present invention should not be limited to the illustrative examples provided herein.

In these examples, generally, an etching process was performed in a process chamber 35 and an interferometric signal of radiation reflected from the substrate 30 and passing through the window 130 was measured during the process. Generally, the etching process, where performed, comprised a main polysilicon etching stage that used a gas composition of 50 sccm $CF_4$ and 40 sccm $SF_6$, a pressure of 2 to 3 mTorr, a source power of 750 watts and a bias power of 90 watts. After a process endpoint was detected by the process monitoring system 25, the main etch stage was stopped and additional polysilicon was removed in a second etching stage using 60 sccm of $SF_8$ at a pressure of about 10 mTorr, source power of 600 watts, and bias power of 1 watt. At periodic time intervals, the window 130 was removed, and the thickness of process residue deposited upon, and the erosion depth into, the window 130, were measured by a stylus step-height measuring device such as a DekTak or an Alpha-step. Also, during the etching process, radiation having a wavelength of 254 nm was reflected off the substrate 130, and the % transmission of ultraviolet radiation passing through the window 130 was measured using a radiation source 150 of known intensity and a radiation detector 160 capable of accurately measuring the intensity of the transmitted radiation.

Example 1

Effect of Process Residues

Figure 11A:
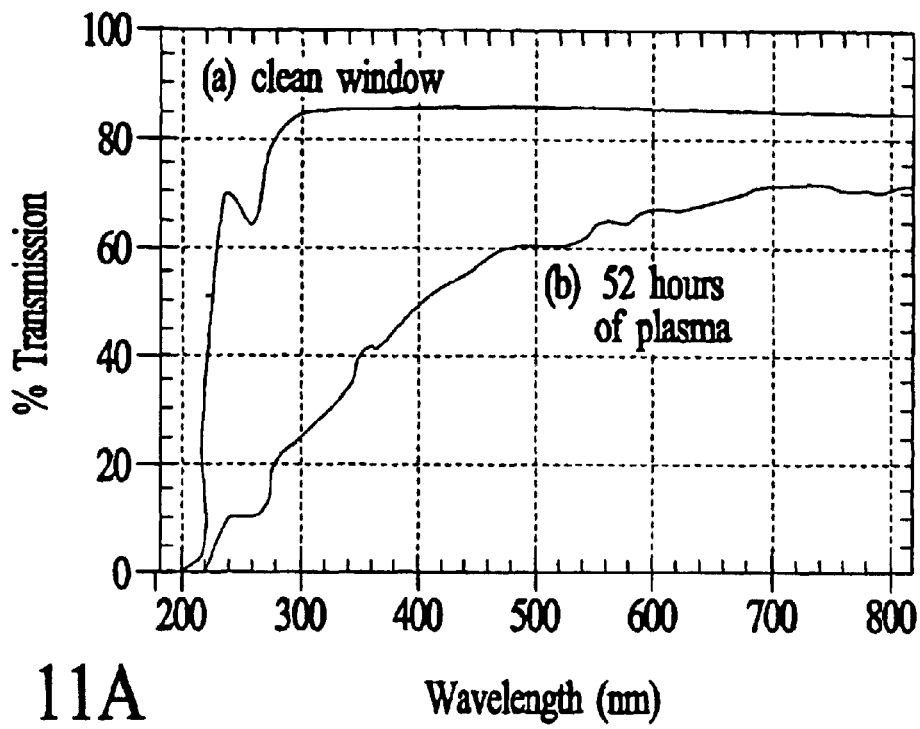
FIG. 11a is a graph showing a transmission spectrum of radiation reflected from a substrate that passes through (a) a clean window, and (b) a window exposed to a process plasma for 52 hours.
Figure 11B:
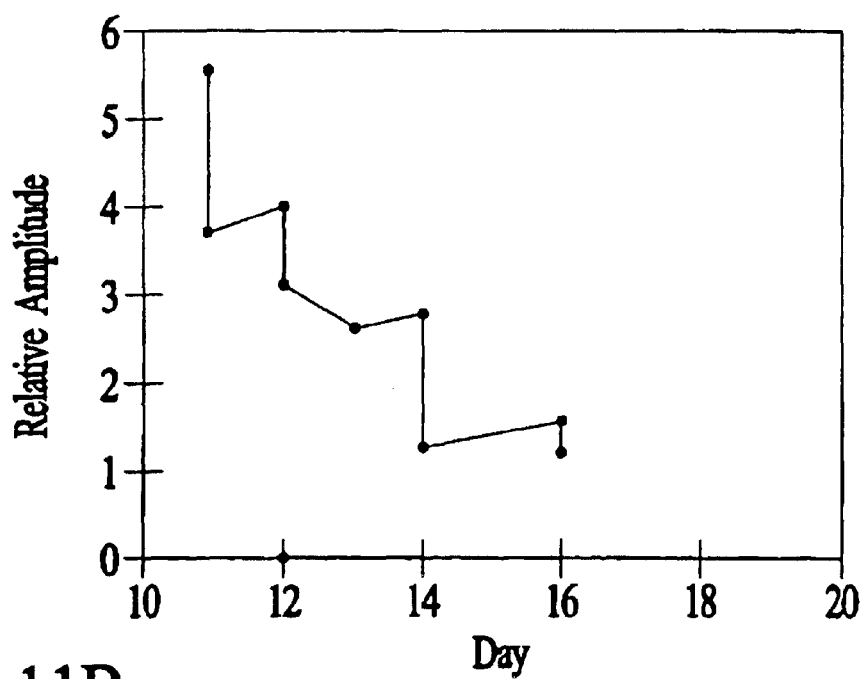
FIG. 11b is a graph showing the decreasing amplitude of substrate reflected radiation over time due to an increasing thickness of process residues formed on a window of a chamber over several days of chamber operation.

In Example 1 (conducted to determine a baseline for comparative purposes) a substrate 30 was etched as described above, and % transmission measurements were taken at the beginning of the etching process when the window 130 in the chamber was clean and free of residue and during etching as process residues were deposited on the window 130. The window 130 was open to the chamber and without any overlying masking portion 140. The "clean window" line (a) in FIG. 11a shows the measured transmission spectrum of the reflected radiation passing through the clean window 130, and the "dirty window" line (b) shows the loss in transmission that occurs when process residues deposited on the window 130 for 52 hours of chamber operation. The change in transmission spectrum demonstrates the high absorption of the process residues deposited on the window 130. FIG. 11b further shows the reduction of the endpoint signal over time that occurs during the etching process. The endpoint signal amplitude was reduced by a factor of five or more due to the increasing thickness of process residue deposited on the window 130.

Example 2

Masking Portion over Window

In Example 2, a mask 140 having an array of apertures 145 was positioned over the window 130 during an etching process and the same measurements were made as in Example 1. The aluminum oxide masking portion 140 comprised a raised pedestal 153 surrounded by an annular lip 154 (as illustrated in FIGS. 8a and 8b and with the chamber orientation of FIG. 3). The raised pedestal was about 19 mm (0.75") thick and contained an array of 19 hexagonal recesses sized having an opening width of about 3.8 mm (0.15") and an aspect ratio of 5:1. The masking portion 140 was positioned about 0.038" from the window 130.

After operating the etching chamber for 80 minutes, the window 130 was disassembled. The thickness of process residue accumulated at portions of the window 130—and the depth of erosion of the window 130—were both measured. The masking portion 140 and its recesses 145 were found to significantly reduce the formation of process residue on the window 130 because the thickness of process residue was found to be below measurable limits. The window 130 was not eroded during the etching process. In addition, the percent change in transmission of ultraviolet radiation through the window 130 was also found to be below detectable limits, i.e., less than 1%.

Examples 3 to 11

These examples were performed to determine the effect of different sized recesses 145 in a masking portion 140 covering window 130. A masking portion 140 having a single circular recess 145 with a predetermined diameter and aspect ratio was, in turn, positioned over a window 130 in the chamber 35. A polysilicon etch process was conducted in the chamber 35 for 80 minutes, and thereafter, the masking portion 140 was removed and the thickness of process residues formed on the window 130 was measured. Thereafter, the window 130 was replaced—uncleaned—and re-examined after an additional 18 hours of chamber operation. The experiment was repeated with new windows 130 and other masking portions 140 having recesses 145 with different diameters or aspect ratios, and for 25 hours of chamber operation. Table I summarizes the thickness of process residues formed upon, and the erosion depth into, the window 130 after 25 hours of chamber processing. Based on the experimentally measured residue thickness and erosion depth levels, the % transmission of radiation (254 nm) through a window 130 after 150 hours of etching was determined as shown.

TABLE I

| No. | RECESS DEPTH (In) | ASPECT RATIO | THICKNESS OF PROCESS RESIDUES AT CENTER (Å) | EROSION AT EDGE OF WINDOW (Å) | PROJECTED TRANSMISSION OF 245 nm RADIATION AFTER 150 HRS OF CHAMBER OPERATION |
|---|---|---|---|---|---|
| 3 | 1" | 0.75 | 4000 to 5000 | −3000 to −6000 Å at 5 mm | High at edge; moderate in center |
| 4 | 0.5" | 1.5 | 0 | −2500 Å | High |
| 5 | 0.25" | 3 | 550 to 650 | −250 Å at 0.5 mm | Moderate |
| 6 | 0.2" | 3.75 | 410 to 500 | None | Moderate to High |
| 7 | 0.15" | 5 | 170 to 200 | None | High |
| 8 | 0.1" | 7.5 | 70 to 100 | None | High |

In examples 9 to 11, the deposition of process residue was measured on windows 130 covered by different sized recesses 145. These recesses 145 were arranged in arrays and the recesses having either (i) a depth of 0.75" and diameter of 0.3", (ii) a depth of 1.5" and diameter of 0.20", or (iii) a depth of 0.75" and diameter of 0.15". Essentially the same thickness of process residue and erosion depth were obtained in specimens as for a window 130 having a single recess 145 with the same aspect ratio.

Figure 12:
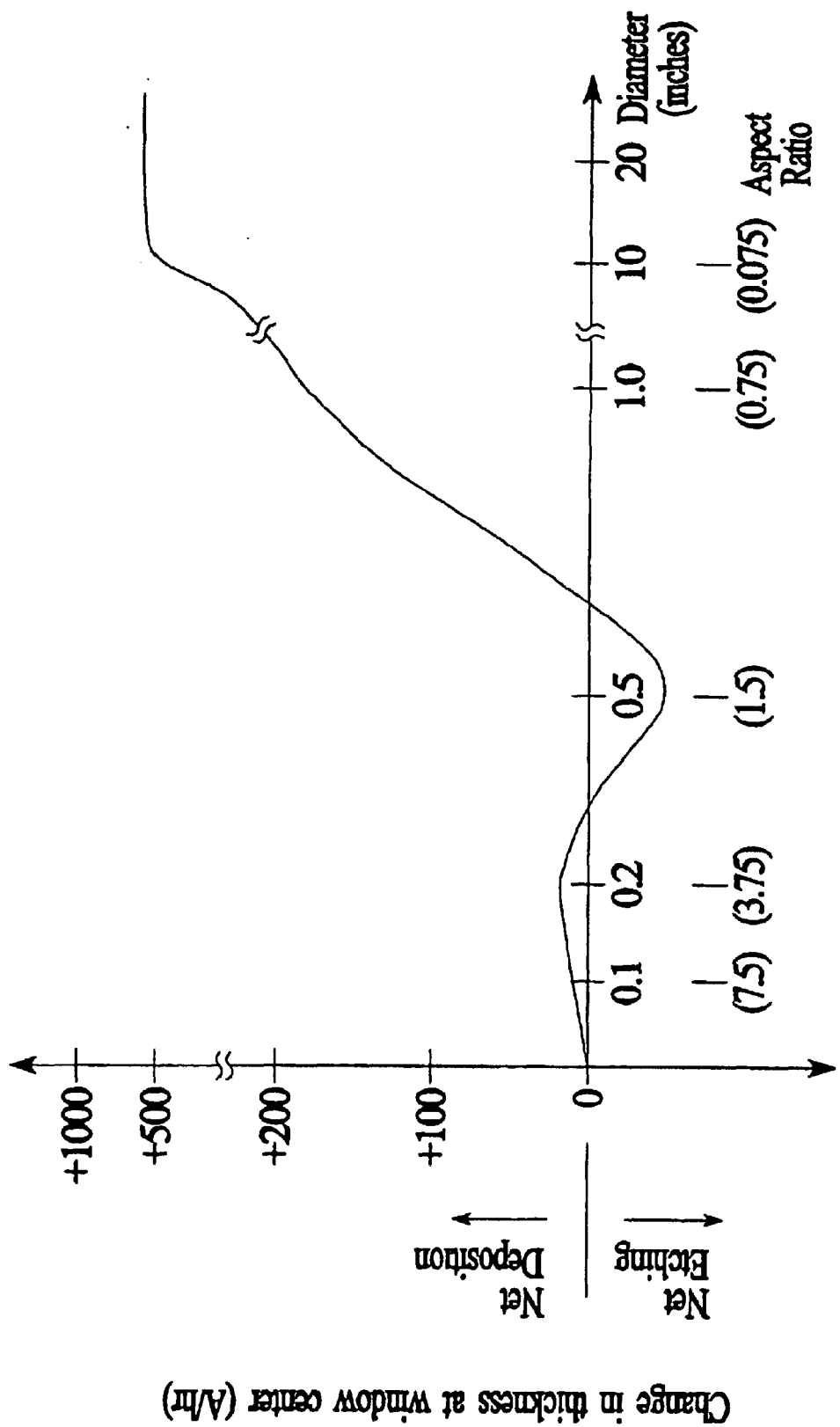
FIG. 12 is a graph showing a determined thickness of process residues formed on a window in relation to the aspect ratio of a recess in a masking portion covering the window.

A summary of the process residue deposition and etching characteristics on windows 130 having different recess configurations, is shown in FIG. 12. The results were unexpected and several effective process regimes were determined. For recesses 145 having large apertures, essentially a conventional unmasked window, the rate of deposition of process residues is high at about 600 angstroms/hour for the process example. For recesses having 145 small apertures (<0.3 inches) which correspond to large aspect ratios (>2), the deposition rate is much smaller and is reduced further as the diameter of the recess decreases. For recesses 145 having an intermediate sized apertures and aspect ratios of from about 1 to about 2, the physical deposition of process residues is reduced but the plasma reaches the window 130, producing net etching of the window 130. Thus, for the described polysilicon etching process, one version the recesses 145 comprise an aspect ratio of from about 0.75:1 to about 7.5:1 and diameters of from 0.01 to about 1.5 inches.

The window erosion data was also used to predict that the window 130 may be used for at least 400 hours of chamber operation without replacement or manual cleaning, which is a significant improvement over the prior art, in which the window 130 had to be replaced far more often. In addition, a window 130 having an overlying masking portion 140 and recess 145 exhibited a rate of residue deposition or erosion that was much less than the erosion rate of a conventional unmasked window 130.

Example 12

Figure 13A:
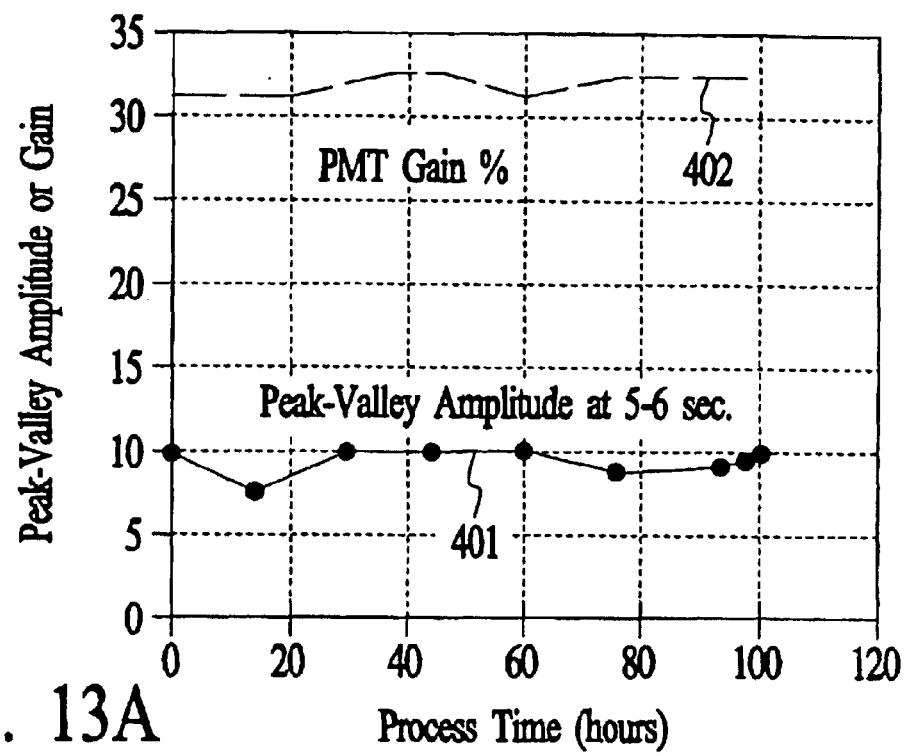
FIG. 13a is a graph showing the peak-valley amplitude of radiation reflected from the substrate and the PMT gain % after about 100 hours operation of an etching chamber.
Figure 13B:
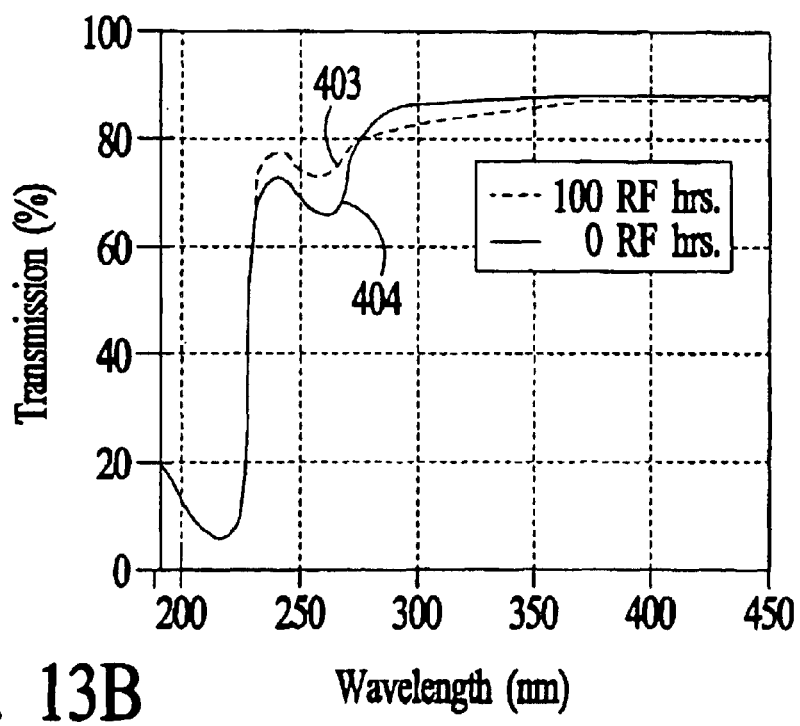
FIG. 13b is a graph showing the % transmission of radiation through a window as a function of the wavelength of radiation before and after 100 hours of etching in the chamber.
Figure 14B:
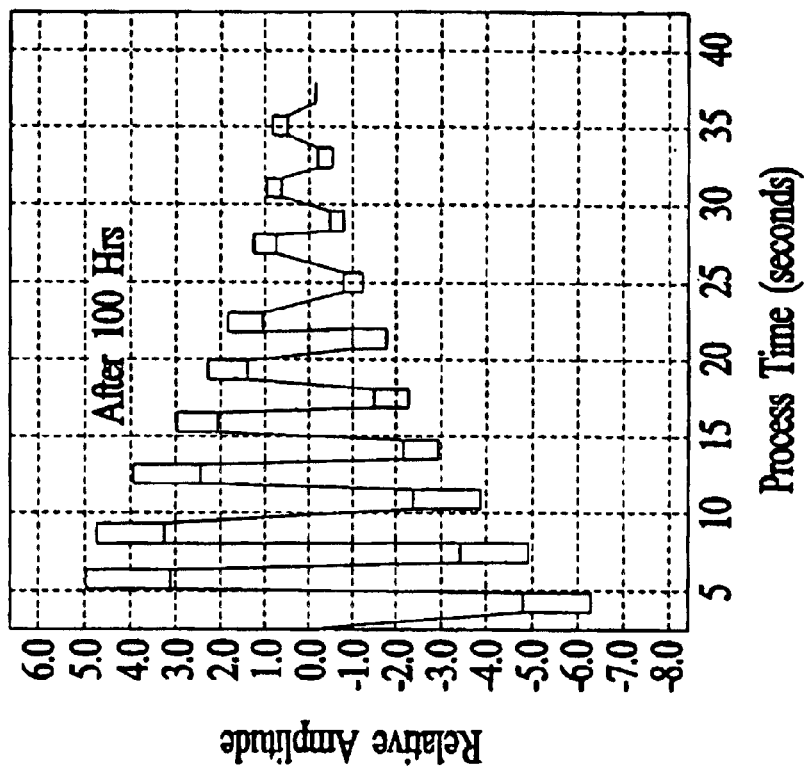
FIGS. 14a and 14b show the relative amplitude of substrate reflected radiation passing through the window before etching and after 100 hours of etching in the chamber, respectively.
Figure 14A:
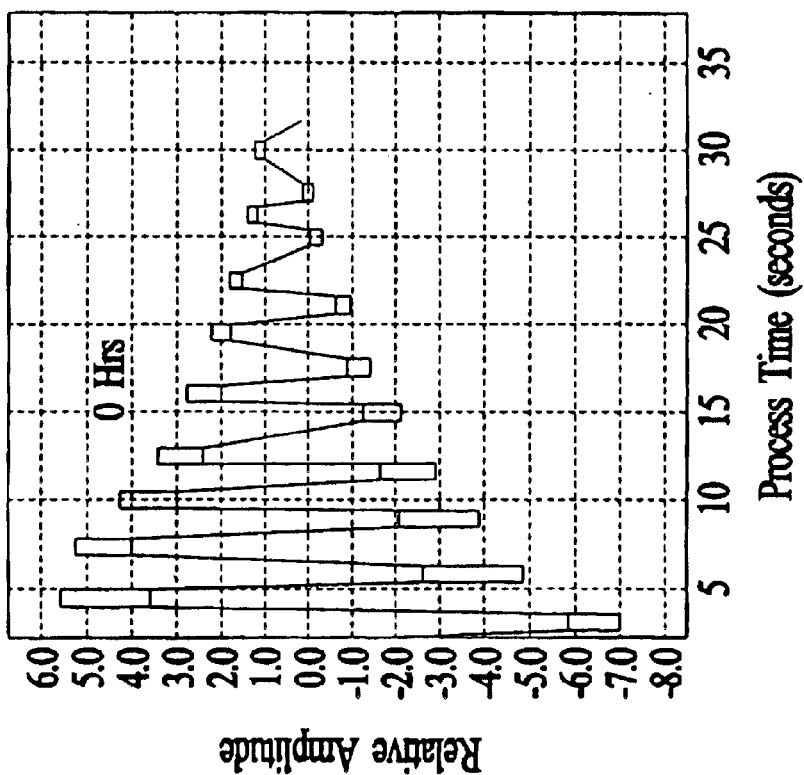

The data from the previous examples was used to design a masking portion 140 having a recess 145 with a depth of 1" and a diameter of 1.5". The masking portion 140 was mounted on a window 130 of a chamber 35 and a polysilicon etching process was run. After processing for 100 RF hours, measurements taken on the window 130 revealed an erosion depth of about 19 microns and a process residue thickness of about 13 microns, and the sidewalls of the recess 145 had a process residue thickness of about 18 microns. Radiation scattering tests performed on the window 130 indicated that the window life would exceed 400 RF plasma hours. In addition, the time at which process endpoint was detected was relatively stable and reliable, with no reduction in amplitude of the radiation signal, as demonstrated in FIG. 13*a*, which shows the peak to valley amplitude of the reflected radiation signal (line 401) to 100 hours operation of the etching chamber 35, along with a relatively constant photomultiplier (PMT) % gain (line 402). FIG. 13*b* shows the transmission spectrum through the window 130 before (line 404) and after (line 403) 100 hours of etching operation showing little or no change in the spectrum of the radiation passing through the window 130 and hence little or no transmission losses after the etching process. The transmission at 254 nm actually increased slightly. The amplitude of the reflected radiation before (FIG. 14*a*) and after (FIG. 14*b*) 100 hours of operation of the chamber 35 also shows little or no change in the height, position or shape of the measured waveform, when a masking portion 140 having a recess 145 was held over the window 130 during the etching process.

Examples 13–20

Figure 15:
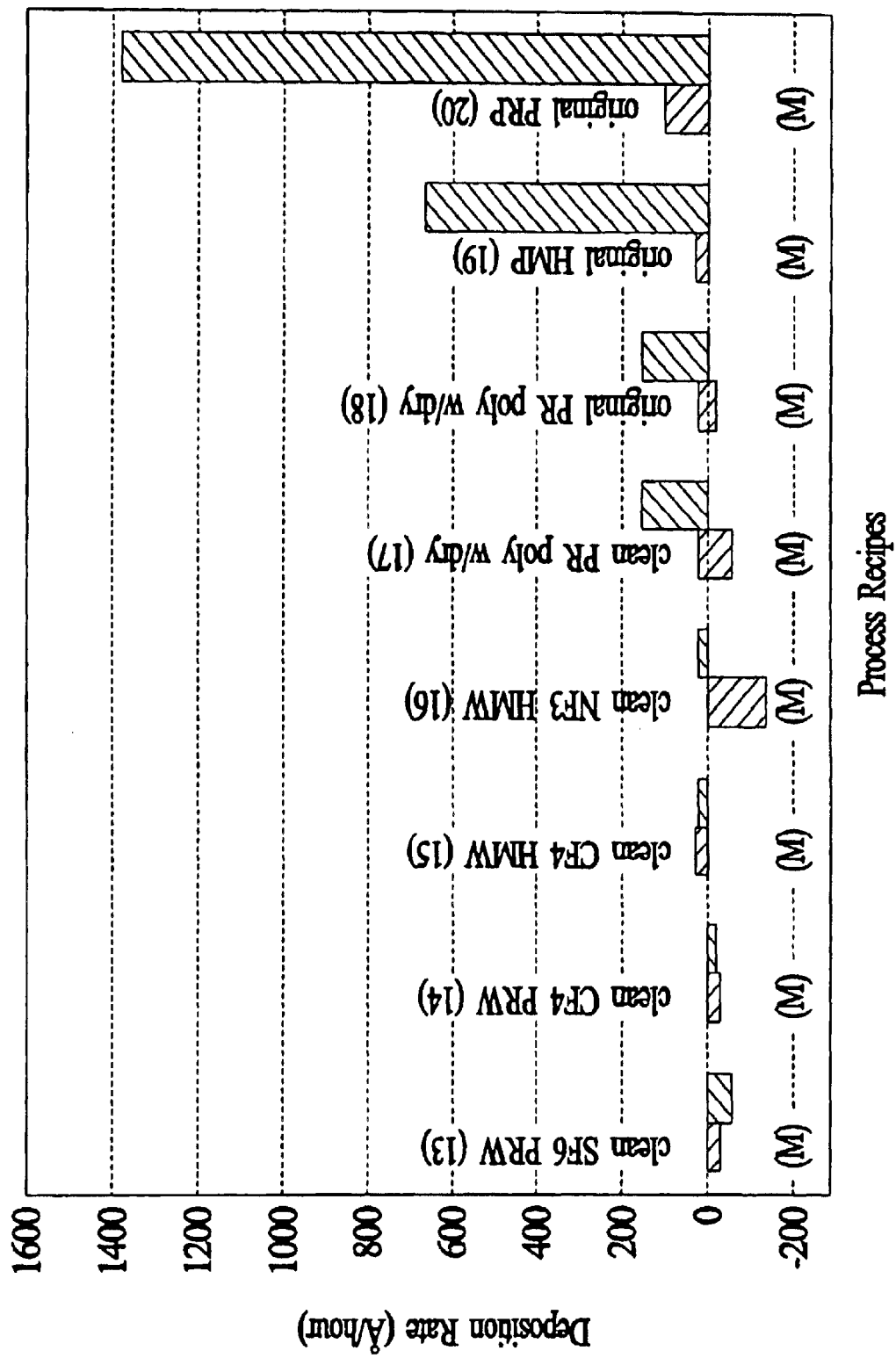
FIG. 15 shows a deposition rates of process residues formed on a window with a masking portion (denoted by M) and on a window without a masking portion, for different process gas recipes.

These examples demonstrate that a window 130 having a recess 145 in an overlying masking portion 140 may be used to reduce the deposition of process residue on the window 130 for a number of different processes. FIG. 15 illustrates schematically the deposition rates of process residue on a window 130 for a number of different processes (along with the major constituents of the process gas) with and without a masking portion 140 on the window 130. The bars with (M) beneath indicate the deposition rate obtained when a masking portion 140 overlies a window 130 and the other bars represent the deposition rate obtained without a masking portion. It is seen that for almost all the processes, the masking portion 140 significantly reduced the rate of residue deposition on the window 130.

Additional tests were conducted to determine if there were any changes in the characteristics or properties of the etched substrate obtained by the etching process—with and without a masking portion 140 in the chamber 35. However, it was determined that the rate of etching of the substrate 30 and the other etching properties, such as the critical dimension loss and profile angle, remained the same, both with and without a masking portion 140 covering a window 130 in the chamber 35. These experiments demonstrated that the masking portion 140 did not significantly affect the results of the etching processes.

The foregoing examples demonstrate that the present invention may be used to accurately and reliably monitor many different process conducted in a chamber 35. The invention reduces the formation of process residues upon a window 130, and may also reduce the erosion of the window 130, in a chamber 35. As a result an amplitude of interferometric radiation measured through the window 130 remained high even after etching of a large number of substrates 30. The masking portion 140 and recess 145 also significantly reduced the attenuation of radiation transmitted through the window 130 for a large process run time, increased radiation signal detection levels, and reduced the need to stop processing to clean window 130. Consequently, the chamber 35 may be advantageously used for an extended time without stopping to remove or clean the window 130.

The present invention is described with reference to certain preferred embodiments thereof; however, other embodiments are possible. For example, the process monitoring system may be used for other applications, as would be apparent to one of ordinary skill, such as in sputtering chambers, ion implantation chambers, or deposition chambers. In addition, equivalent configurations of the window may be designed by others of ordinary skill based upon the teaching herein. Therefore, the spirit and scope of the appended claims should not be limited to the description of the preferred embodiments contained herein.

What is claimed is:

1. A substrate processing apparatus comprising:
   a process chamber comprising a substrate support, gas inlet, gas energizer, gas exhaust, and a wall having a radiation permeable wall portion, the radiation permeable wall portion comprising a plurality of holes that extend through a portion or the entire thickness of the radiation permeable wall portion, the holes being sized to limit the deposition of process residues therein; and
   a process monitoring system to monitor radiation passing through at least one of the holes in the radiation permeable wall portion.

2. An apparatus according to claim 1 wherein the process monitoring system is capable of monitoring a process that may be conducted in the process chamber to process a substrate, by monitoring radiation that is reflected from the substrate and that is passed through at least one of the holes in the radiation permeable wall portion.

3. An apparatus according to claim 1 wherein the holes originate at an internal surface of the radiation permeable wall portion.

4. An apparatus according to claim 3 wherein the holes terminate in the radiation permeable wall portion.

5. An apparatus according to claim 1 wherein the holes comprise an aspect ratio of at least about 0.25:1.

6. An apparatus according to claim 5 wherein the holes comprise an aspect ratio of at least about 3:1.

7. An apparatus according to claim 5 wherein the holes comprise an aspect ratio of less than about 12:1.

8. An apparatus according to claim 1 wherein the holes comprise an opening size of from about 0.1 to about 50 mm.

9. An apparatus according to claim 1 wherein the holes comprise a depth of from about 0.5 to about 500 mm.

10. An apparatus according to claim 1 wherein the holes comprise a diameter of less than about 10 times a thickness of a plasma sheath that may be formed in the chamber.

11. An apparatus according to claim 1 wherein the radiation permeable wall portion comprises one or more of $Al_2O_3$, $SiO_2$, AlN, BN, Si, SiC, $Si_3N_4$, $TiO_2$, $ZrO_2$ and mixtures and compounds thereof.

12. An apparatus according to claim 11 wherein the radiation permeable wall portion comprises quartz.

13. An apparatus according to claim 1 wherein the wall further comprises a masking portion.

14. A substrate processing apparatus comprising:
   a chamber having a support, gas inlet, gas energizer, and exhaust, and a ceiling having an integral radiation permeable wall portion, the radiation permeable wall portion having a hole that extends through a portion or the entire thickness of the radiation permeable wall portion, the hole being sized to limit the deposition of process residues therein; and
   a process monitoring system to monitor radiation passing through the hole in the radiation permeable wall portion, whereby a substrate held on the support may be processed by process gas introduced by the gas inlet, energized by the gas energizer, and exhausted by the exhaust.

15. An apparatus according to claim 14 wherein the hole controls an access of energized gas species to the radiation permeable wall portion.

16. An apparatus according to claim 14 wherein the hole comprises an aspect ratio of at least about 0.25:1.

17. An apparatus according to claim 14 wherein the process monitoring system is capable of monitoring radiation that is reflected from the substrate and that is passed through the hole in the radiation permeable wall portion.

18. A substrate processing apparatus comprising:

a process chamber comprising
 a substrate support,
 a gas inlet,
 a gas energizer,
 a gas exhaust, and
 a wall comprising a radiation permeable wall portion, the radiation permeable wall portion having a plurality of holes originating at an internal surface of the radiation permeable wall portion, the holes having an aspect ratio sized to limit the deposition of process residues therein; and
 a process monitoring system to monitor radiation passing through at least one of the holes in the radiation permeable wall portion.

19. An apparatus according to claim 18 wherein the process monitoring system is capable of monitoring a process that may be conducted in the chamber to process a substrate, by monitoring radiation that is reflected from the substrate and that is passed through at least one of the holes in the radiation permeable wall portion.

20. An apparatus according to claim 18 wherein the holes comprise an aspect ratio of at least about 0.25:1.

21. An apparatus according to claim 18 wherein the holes comprise a passageway inclined at an angle of less than about 90 degrees.

22. An apparatus according to claim 18 wherein the radiation permeable wall portion comprises one or more of $Al_2O_3$, $SiO_2$, AlN, BN, Si, SiC, $Si_3N_4$, $TiO_2$, $ZrO_2$ and mixtures and compounds thereof.

23. An apparatus according to claim 18 wherein the holes are arranged to pass therethrough radiation originating from the plasma or radiation reflected from different portions of the substrate.

24. A substrate processing apparatus comprising:

a process chamber comprising a substrate support, a gas inlet, a gas energizer, a gas exhaust, and a sidewall about the support, the sidewall having an integral radiation permeable wall portion, the radiation permeable wall portion comprising at least one hole that extends through a portion or the entire thickness of the radiation permeable wall portion, the hole being sized to limit the deposition of process residues therein; and a process monitoring system to monitor radiation passing through the hole in the radiation permeable wall portion.

25. An apparatus according to claim 24 further comprising a second hole in the sidewall.

26. An apparatus according to claim 24 wherein the hole is inclined relative to the sidewall.

27. An apparatus according to claim 26 wherein the hole is inclined from about 50 degrees to about 60 degrees relative to the sidewall.

28. An apparatus according to claim 24 wherein the process monitoring system is capable of monitoring a process that may be conducted in the process chamber to process a substrate, by monitoring radiation that is reflected from the substrate and that is passed through the hole in the radiation permeable wall portion.

29. An apparatus according to claim 24 wherein the hole originates at an internal surface of the radiation permeable wall portion.

30. An apparatus according to claim 29 wherein the hole terminates in the radiation permeable wall portion of the sidewall.

31. An apparatus according to claim 24 wherein the hole comprises an aspect ratio of at least about 0.25:1.

32. An apparatus according to claim 24 wherein the hole comprises an opening size of from about 0.1 to about 50 mm.

33. An apparatus according to claim 24 wherein the hole comprises a depth of from about 0.5 to about 500 mm.

34. An apparatus according to claim 24 wherein the radiation permeable wall portion comprises a plurality of holes.

35. An apparatus according to claim 24 wherein the sidewall comprises a plurality of holes on opposing sides of the support.

36. An apparatus according to claim 24 wherein the sidewall further comprises a masking portion.

* * * * *